United States Patent
Deruginsky et al.

(10) Patent No.: US 7,756,279 B2
(45) Date of Patent: Jul. 13, 2010

(54) MICROPHONE PREAMPLIFIER

(75) Inventors: Michael Deruginsky, Hillerod (DK);
Claus Erdmann Furst, Roskilde (DK)

(73) Assignee: AudioAsics A/S, Rosklide (DK)

( * ) Notice: Subject to any disclaimer, the term of this patent is extended or adjusted under 35 U.S.C. 154(b) by 0 days.

(21) Appl. No.: 10/595,403

(22) PCT Filed: Oct. 14, 2004

(86) PCT No.: PCT/DK2004/000707

§ 371 (c)(1),
(2), (4) Date: Jun. 28, 2006

(87) PCT Pub. No.: WO2005/039041

PCT Pub. Date: Apr. 28, 2005

(65) Prior Publication Data

US 2007/0076904 A1    Apr. 5, 2007

Related U.S. Application Data

(60) Provisional application No. 60/510,145, filed on Oct. 14, 2003, provisional application No. 60/542,305, filed on Feb. 9, 2004.

(51) Int. Cl.
*H04R 3/00* (2006.01)
*H03F 3/45* (2006.01)

(52) U.S. Cl. .................. 381/95; 381/113; 381/114; 381/115; 330/69; 330/259

(58) Field of Classification Search .................. 381/95, 381/113, 114, 115, 122, 56; 330/69, 259
See application file for complete search history.

(56) References Cited

U.S. PATENT DOCUMENTS

| 4,293,823 | A |   | 10/1981 | Hochberg et al. |
|---|---|---|---|---|
| 5,337,011 | A | * | 8/1994 | French et al. ............... 330/258 |
| 5,357,214 | A |   | 10/1994 | Heyl et al. |
| 6,150,875 | A | * | 11/2000 | Tsinker ...................... 327/552 |
| 6,160,450 | A |   | 12/2000 | Eschauzier et al. |
| 6,424,480 | B1 | * | 7/2002 | Bhandari et al. .............. 360/67 |

(Continued)

FOREIGN PATENT DOCUMENTS

| GB | 2 218 594 | 11/1989 |
|---|---|---|
| WO | WO 2005/076466 A1 | 8/2005 |

OTHER PUBLICATIONS

International Search Report; dated Oct. 2, 2005, 1 page.

(Continued)

*Primary Examiner*—Vivian Chin
*Assistant Examiner*—George C Monikang
(74) *Attorney, Agent, or Firm*—Fish & Richardson P.C.

(57) ABSTRACT

A microphone preamplifier, comprising a differential input (102) stage with a first and a second input terminal and an output stage with an output terminal; where the microphone preamplifier is integrated on a semiconductor substrate. A feedback circuit, with a low-pass frequency transfer function (103), is coupled between the output terminal and the first input terminal and integrated on the semiconductor substrate. The second input terminal provides an input for a microphone signal (105). Thereby a very compact (with respect to consumed area of the semiconductor substrate), low noise preamplifier is provided.

59 Claims, 18 Drawing Sheets

U.S. PATENT DOCUMENTS

| | | | |
|---|---|---|---|
| 6,504,937 B1 | 1/2003 | Papadopoulos et al. | |
| 6,731,163 B2 * | 5/2004 | Huckins et al. | 330/69 |
| 6,771,122 B2 * | 8/2004 | Jin et al. | 330/69 |
| 7,489,791 B2 * | 2/2009 | Kunnen et al. | 381/113 |

OTHER PUBLICATIONS

Losmandy, "Operational Amplifier Applications for Audio Systems", Journal of the Audio Engineering Society, vol. 17, No. 1 (1969).

* cited by examiner

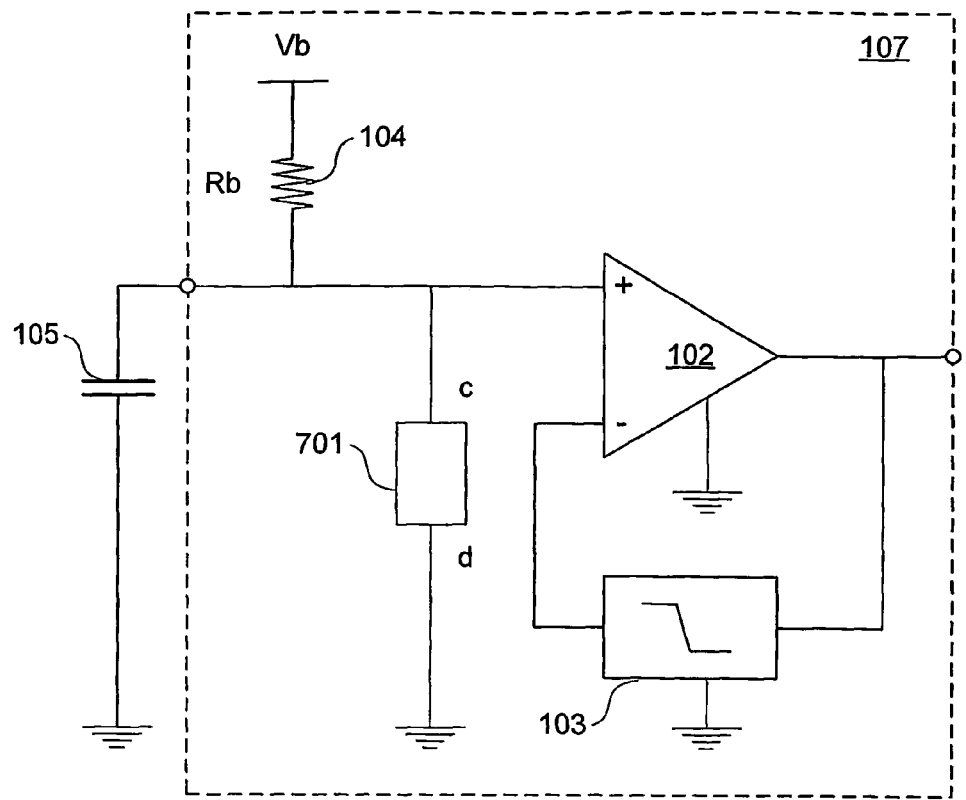
*Fig. 7a*
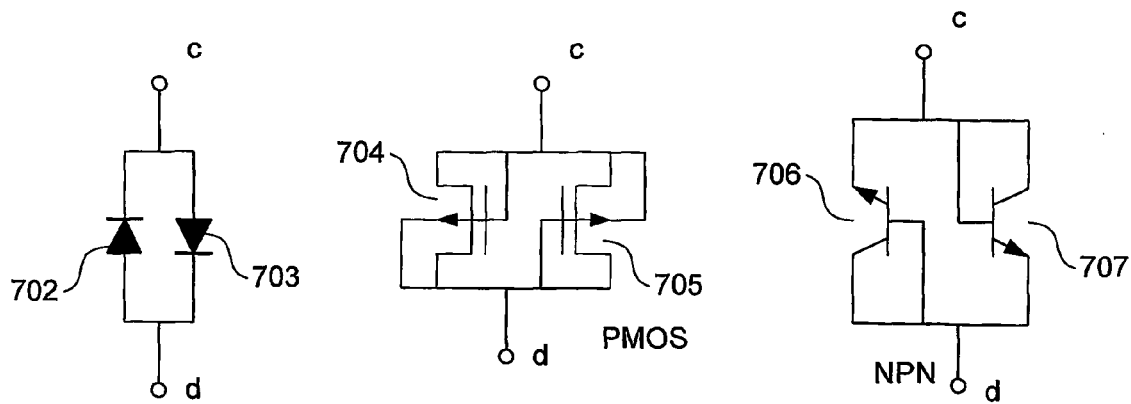
*Fig. 7b*   *Fig. 7c*   *Fig. 7d*

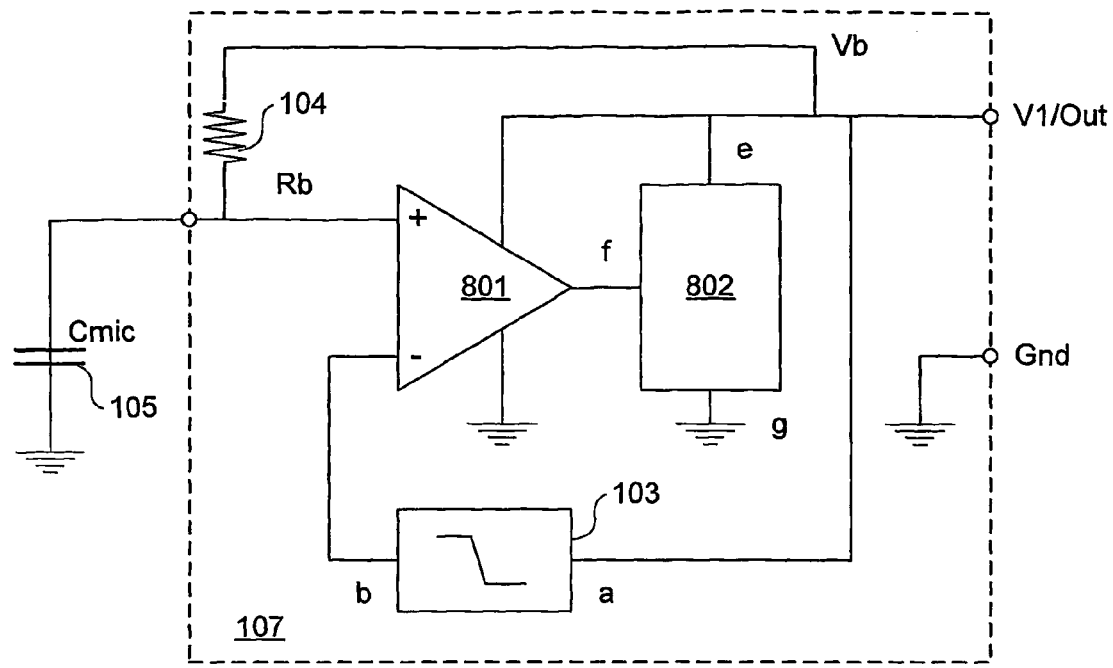
*Fig. 8a*
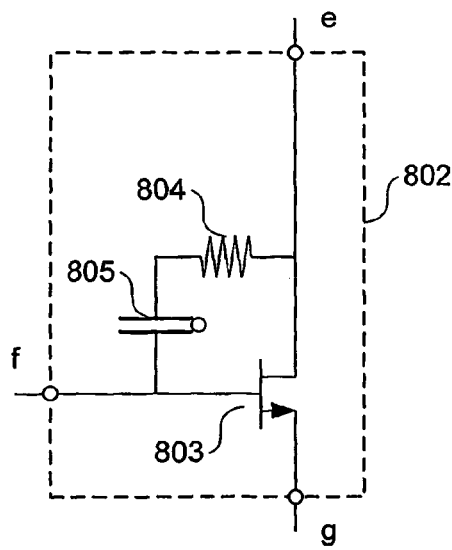 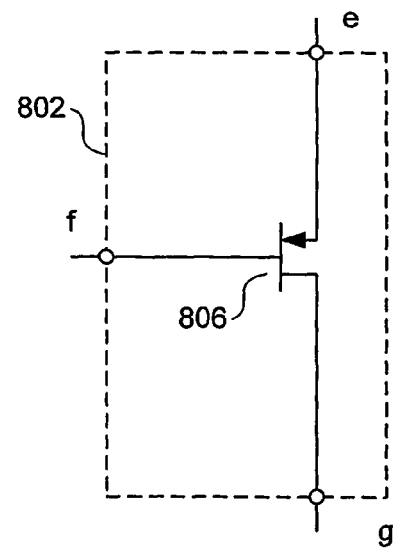
*Fig. 8b*       *Fig. 8c*

MICROPHONE PREAMPLIFIER

CROSS-REFERENCE TO PRIOR APPLICATION

The above-referenced application is the U.S. National Phase of international Patent Application PCT/DK2004/000707, filed Oct. 14, 2004, which claims priority from U.S. Provisional Application No. 60/510,145, filed Oct. 14, 2003, and U.S. Provisional Application No. 60/542,305, filed Feb. 9, 2004, which is incorporated by reference herein. The International application was published in English on Apr. 28, 2005 as WO 2005/039401 A1.

INTRODUCTION

The preferred type of microphone for telecom applications (ie Mobile phones) has for many years been electret microphones. This type of microphone is based on the principle of a capacitor, which is formed by a movable member that constitutes a membrane of the microphone and another member, eg a so-called back plate of the microphone. One of the members of the microphone, preferably the membrane, is charged by a constant electrical charge.

A sound pressure detected by the microphone will cause the membrane to move and consequently change the capacitance of the capacitor formed by the membrane member and the other member. When the charge on the capacitor formed by these two members is kept constant, the voltage across the two capacitor members will change with the incoming sound pressure level. As the charge on the microphone capacitor has to be kept constant to maintain proportionality between sound pressure and voltage across the capacitor members, it is important not to load the microphone capacitance with any resistive load. A resistive load will discharge the capacitor and thereby degrade or ruin the capacitors performance as a microphone.

Therefore, in order to pick up a microphone signal from the capacitor, amplifiers configured with the primary objective of providing high input resistance are preferred to buffer the capacitor from circuits which are optimized for other objectives. The amplifier connected to pick up the microphone signal is typically denoted a preamplifier or a buffer amplifier or simply a buffer. The preamplifier is typically connected physically very close to the capacitor—within a distance of very few millimeters or fractions of millimeters.

For small sized microphones only a very limited amount of electrical charge can be stored on one of the microphone members. This furthers the requirement of high input resistance. Consequently, the input resistance of preamplifiers for small sized microphones has to be extremely high—in the magnitude of Giga ohms. Additionally, the input capacitance of this amplifier has to be very small in order to achieve a fair sensitivity to sound pressure.

Traditionally, this buffer amplifier or preamplifier has been implemented as a simple JFET. The JFET solution has been sufficient, but demands in the telecom industry call for ever smaller microphones—with increased sensitivity. This yields a contradiction in terms since sensitivity of the microphone capacitor drops as size goes down. All other things being equal, this will further reduce the sensitivity of the microphone and the buffer in combination. The demands in the telecom industry are among other things driven by market trends which encompass hands free operation of different types of small-sized equipment and more widespread application of microphones in eg camera/video applications.

Today telecom microphones typically have a sensitivity of −40 dBV and a capacitance of 7 pF. This capacitance is also denoted the cartridge capacitance. The term 'cartridge' is used to designate the microphone without the preamplifier. The vast majority of JFETs for this purpose have an input capacitance of approximately 5-7 pF. Comparing this input capacitance to the cartridge capacitance it can be deduced that half of the microphone signal is lost in being acquired by the preamplifier—before it is being amplified.

Telecom microphones with an integrated preamplifier are sold in high volumes and at very low prices. As cost of an amplifier for a telecom microphone is directly related to the size of the preamplifier chip die it is important, for the purpose of reducing price, that the preamplifier die is as small as possible.

So obviously, there is a need for microphone preamplifiers with gain and very low input capacitance, and lowest possible preamplifier die area. Additionally, low noise is important. Low noise is important as noise can be traded for area—ie if the circuit has low noise and a noise lower than required, this noise level overhead can be traded for lower chip die area and it is thus possible to manufacture the preamplifier at lower cost.

CMOS microphone preamplifiers have proven to be superior to JFET microphone preamplifiers in resent years since they can be designed with lower noise and lower input capacitance while providing a fair amount of gain.

In hearing aids, microphone preamplifiers are exclusively designed in CMOS. The reason for this is that CMOS amplifiers designed in CMOS technology provides signal to noise ratios far beyond what can be reached by amplifiers implemented in JFET technology. This applies in particular when the cartridge capacitance is very low.

When designing a preamplifier in CMOS technology for a microphone there is normally three noise sources. These sources are noise from a bias resistor, 1/f noise from an input transistor, and white noise from the input transistor. We assume that input transistor noise dominates. Both white noise and 1/f noise can be minimized by optimizing the length and the width of the input transistor(s). This applies for any input stage eg a single transistor stage or a differential stage. The noise from the bias resistor can also be minimized. If the bias resistor is made very large then the noise from the resistor will be high pass filtered and the in-band noise will be very low. This has the effect though that the lower bandwidth limit of the amplifier will be very low. This can be a problem as the input of the amplifier will settle at a nominal value only after a very long period of time after power up. Additionally, signals with intensive low frequency content arising form eg slamming of a door or infra sound in a car can overload the amplifier. Another related problem is small leakage currents originating from mounting of the die inside a microphone module. Such currents will due to the extreme input impedance establish a DC offset. This will reduce the overload margin of the amplifier.

RELATED ART

Several solutions have been proposed using preamplifiers based on JFET or other technologies. However, these solutions do inherently have a relatively high noise level. Consequently, the prior art solutions can not be designed for smallest possible die area.

In hearing aid microphones the problem of excessive sensitivity to infrasound is handled by a two stage configuration with a buffer amplifier as input stage followed by a high-pass filter. When the signal has been high-pass filtered it doesn't contain the large low frequency components which could overload the amplifier and it can then be amplified further.

This approach has proven to work well with hearing aid microphones where the cartridge sensitivity is relatively high eg about 20 mV/Pa.

For telecom microphones the cartridge sensitivity is normally about as less as 5-7 mV/Pa. However, new types of applications require a microphone sensitivity of about 40 mV/Pa or more. The microphone/preamplifier configurations known from the field of hearing aids would—from a technical perspective—work fine, but for telecom applications these configurations would be far too expensive as they require a substantial amount of chip die area relative to the cost dictated chip area available for telecom microphones.

The two stage configuration has two disadvantages; as it has two stages, it is noisier and because there is no gain in the first stage the physical size of the high pass filter has to be relatively large. It should be noted that Noise and area are directly related. The size of the filter could be minimized by increasing the gain of the first stage, but the amplifier would be sensitive to overload because of low frequency components which are not diminished until in the subsequent high-pass filter. Thus the solution originally developed for hearing aid microphones will be far from optimal for the new high sensitive telecom microphones. The area of the amplifier die would simply be too large and the device consequently too costly.

The demand for smaller microphones and consequently the application of smaller microphones results in a smaller microphone capacitance. This will in turn increase the spectral density of noise within the audio range. Therefore a larger bias resistor is required to compensate for the otherwise increased noise density in the audio range.

The demand for a large input bias resistor requires a small input leakage current. Such a small input leakage current can only be obtained by CMOS technology. In order to achieve a good signal-to-noise ratio, CMOS technology combined with a bias resistor larger than 10 GOhm is preferred. In hearing aid applications the above is provided by a simple 0-dB buffer in CMOS technology combined with a large bias resistor. This will provide a feasible design since the sensitivity of microphones for hearing aid applications generally is relatively high.

However, since sensitivity is traded for low prise, microphones for telecommunications purpose are less sensitive. From a market perspective, there is a demand for a larger sensitivity of the microphone and preamplifier in combination. So, therefore the gain in the preamplifier is to be increased to meet the demand. Additionally, there is a demand for low noise in the audible range. Moreover, in order to ensure a good signal-to-noise ratio while meeting the demand for a relatively large sensitivity, the input capacitance of the preamplifier must be small to avoid an unnecessary signal loss from the microphone (cf. the equivalency of the microphone signal being exposed to a voltage divider constituted by the capacitances).

Since, the chip area occupied by the preamplifier must be as small as possible to obtain relatively low cost; the preamplifier must be as small as it can be. Therefore, since amplifier configurations known from hearing aids are generally not optimised for chip area to the same extent, these configurations are not applicable. Further, one should bear in mind that buffers or amplifiers applied in hearing aids are not configured to provide such high gain levels as are required for the low-sensitivity microphones used in telecommunication applications. In hearing aids chips, more space is required for the same noise performance since buffers are required to avoid overload in hearing aids.

In the above, various aspects of known microphone preamplifier configurations have been discussed in the light of relevant semiconductor technologies for implementing the configurations.

As the total sensitivity of the new types of telecom microphones are very high, the output signal swing of the microphone can become very large; eg about 1 Vpp, which is far beyond what seen previously in both telecom and hearing aid market. The fact that the telecom microphone has to be operated with two terminals (combined out and power) makes the design for a large maximum output signal swing even more difficult. This calls for solutions different from hearing aid applications.

The intrinsic sensitivity of telecom ECM's are normally relatively low. As a consequence of this the preamplifier for a telecom ECM requires gain.

Furthermore the telecom market today requires even higher sensitivity than before. The consequence of this is that even higher gain from the preamplifier is required. But still the same overload margin is required. Also the ability to handle large low frequency signals such as car rumbleling and door slamming should be the same.

SUMMARY OF THE INVENTION

Thus, it is an objective of the present invention to provide a preamplifier with the lowest possible input capacitance, lowest possible noise, largest output signal swing in a two-terminal configuration and at the same time exhibiting the lowest smallest possible chip area.

It is an objective of the present invention to provide a preamplifier having a large power supply rejection and low distortion.

It is an objective of the present invention to provide an amplifier which is able to handle slowly varying signals with relatively large amplitude at its input terminal while at the same time being able to amplify a low level signal with a higher frequency with low distortion.

It is an objective of the present invention to provide an amplifier which performance is very insensitive towards leakage and parasitic couplings connected to the input.

The invention relates to a microphone preamplifier, comprising a differential input stage with a first and a second input terminal and an output stage with an output terminal; where the microphone preamplifier is integrated on a semiconductor substrate; and a feedback circuit, with a low-pass frequency transfer function, coupled between the output terminal and the first input terminal and integrated on the semiconductor substrate. The second input terminal provides an input for a microphone signal.

Thereby a semiconductor microphone preamplifier is provided with a filter feedback configuration. This preamplifier can provide a large loop-gain outside the audio band and will give rise to very little distortion in the audio band. But more importantly, inter-modulation distortion introduced by frequency components at low frequencies, outside the audio band, will be very low. The loop-gain characteristic provided by the feed-back configuration provides e.g. lower distortion.

BRIEF DESCRIPTION OF THE DRAWINGS

FIG. 7a shows an amplifier with a feed-back filter and an input clamping circuit;

FIG. 7b shows a diode based input clamping circuit;

FIG. 7c shows a PMOS based input clamping circuit;

FIG. 7d shows a NPN transistor based input clamping circuit;

FIG. 8a shows an amplifier with a feed-back filter and an output stage;

FIG. 8b shows common source output stage;

FIG. 8c shows source follower output stage;

FIG. 1 shows a microphone comprising a preamplifier with a feedback filter. The microphone 101 comprises a microphone member Cmic, 105 biased via a resistor Rb, 104 coupled to a voltage source 108 that receives a current input via the output terminal, designated Pwr/Out, of the microphone 101. In an alternative configuration, the resistor Rb, 104 is connected to a ground reference and the microphone is biased by providing a DC offset to an input terminal of the amplifier 102. Thus, the output terminal serves to provide a bias voltage Vb, via the voltage source 108 and operating power to the microphone preamplifier 102 and its feedback filter 103 and to provide a microphone output signal responsive to a sound pressure on the microphone member Cmic, 105.

A circuit node established at the interconnection of the microphone Cmic, 105 and the bias resistor Rb, 104 is connected to a non-inverting input (+) of the operational amplifier 102. The amplifier 102 is provided with a feedback circuit 103. The feedback circuit 103 has in input port designated 'a' coupled to receive an output signal from the amplifier 102 and an output port designated 'b' coupled to an inverting input (−) of the amplifier 102. The preamplifier comprising the amplifier 102 and feedback circuit 103 is implemented on a semiconductor substrate 107.

The amplifier 102 and the feedback circuit 103 have, in combination, a frequency transfer function from the non-inverting input (+) to the output (which corresponds to the circuit node connected to the input port 'a' of the feedback circuit). This frequency transfer function has a high-pass characteristic.

However, the feedback circuit has a frequency transfer function from the port 'a' to the port 'b' with a zero and a pole; wherein the zero is located at a higher frequency than the pole. Thus the feedback circuit has a low-pass characteristic.

The feedback circuit in the form of a filter can be a first order filter or it can be of higher order; eg second order, third order or fourth order. Also it can be implemented as a passive circuit or as an active circuit. The feedback loop assures that the overall gain of the amplifier with feedback is relatively low at low frequencies and relatively high at audio band frequencies.

The preamplifier is powered from its output terminal designated Pwr/Out. The amplifier is coupled as a non-inverting amplifier with the microphone connected to the non-inverting input. This ensures that the capacitive loading of the microphone is very low. Due to the feedback, the inverting input terminal (−) of the amplifier 102 will exactly follow the non-inverting terminal (+). If the input stage of the amplifier 120 is a differential transistor pair (i.e. a differential stage), gate-source voltages of the transistor pair will remain constant and the input capacitance will consequently be very low. A more detailed description of one possible embodiment of an amplifier with a differential input stage is provided in connection with FIG. 6.

To set the output DC level of the amplifier a DC offset can be build into the amplifier or even better into the filter. An implementation of an amplifier with build in offset is explained in FIGS. 5d, 10a, 10b and 10c.

Figure 2:
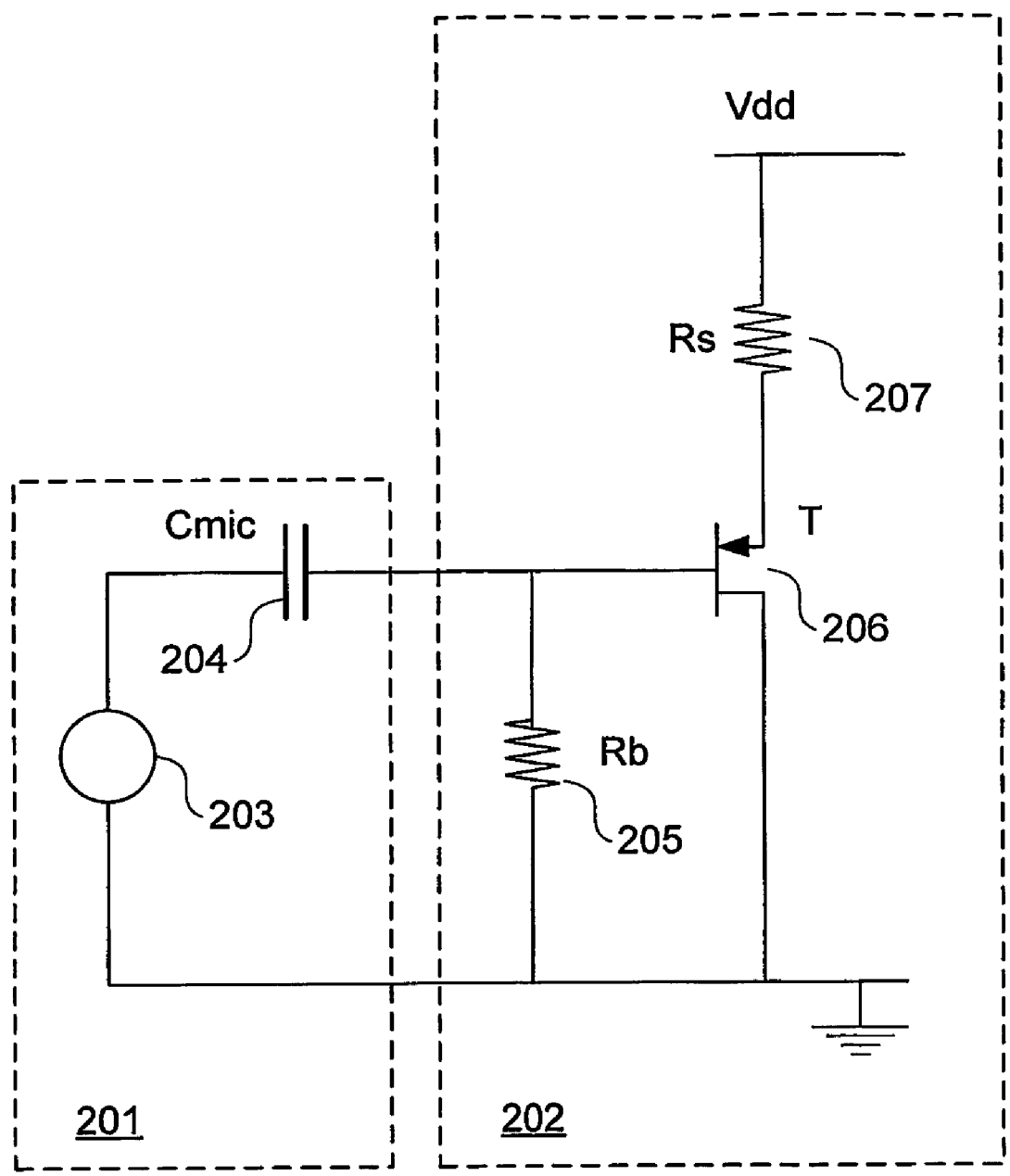
FIG. 2 shows a source-follower coupled to a microphone and illustrates noise sources in a microphone amplifier.

FIG. 2 shows a source-follower coupled to a microphone cartridge element. The microphone cartridge element 201 is illustrated as a circuit model with a voltage generator 203 coupled in series with a capacitor Cmic, 204. The source-follower 202 comprises an active device in the form of a PMOS device T, 206 which is coupled to a ground reference by means of its drain terminal and to a supply voltage Vdd via a source resistor Rs, 207. The input of the source-follower is provided at the circuit node established by the gate terminal of the active device, the bias resistor, Rb, and the capacitor Cmic.

This circuit is a simple circuit it and is very useful for explaining the basic function of a microphone preamplifier. This circuit has three significant noise sources; ie noise from the bias resistor Rb, white noise from the PMOS device T, 206 and 1/f noise from the PMOS device T, 206.

The figure shows a very simple amplifier, but all amplifiers have these three significant noise sources.

Figure 3:
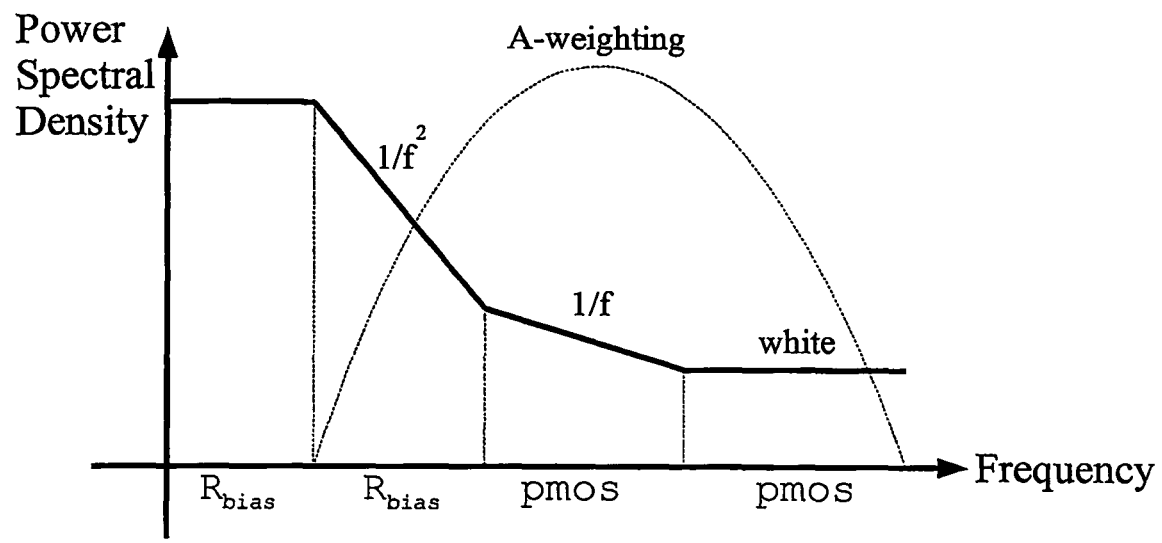
FIG. 3 shows the spectral noise density of the source-follower.

FIG. 3 shows the spectral noise density of the source-follower. The spectral noise density is shown as a function of frequency, f. The noise density is shown together with the so-called A-weighing curve.

A source follower has been used as an example but the spectral density of the noise will have the same shape for any CMOS amplifier. The guidelines for optimizing the spectral noise density for best signal-to-noise ratio, SNR, are basically also the same for other types of amplifiers. It can be described how to minimize each component of the spectral noise density.

Firstly, the bias resistor generated noise component is explained. On the figure it can be seen where this noise component is dominating—see the frequency range designated 'Rbias'. The total noise power coming from the bias resistor can be calculated as kT/C where k is Bolzmans constant, T is temperature in Kelvin and C is the capacitance connected to the resistor; normally dominated by the microphone capacitance. On the figure is also shown the well-known A-weighting function and it can be seen that apart from the total noise power of kT/C (which is given by the microphone capacitance) also the location of the noise has an importance. That is, if the bias resistor can be made very large then the noise power inside the A-weighting function can be made very small. So the trick is to use a very large bias resistor to shape to appear as far away from the centre of the A-weighing curve as possible.

Secondly, the PMOS generated noise is explained. From the PMOS device of the source follower originates a 1/f noise component and a white noise component. These noise components can be made small in magnitude by increasing the gate area of the device contributing with the noise. By making the device very large both the 1/f and the white noise can be reduced. The 1/f noise can even be reduced to be completely negligible by using a transistor with a large area. The consequence of making the transistor very large is though that the signal is damped as the microphone is capacitively loaded by the larger intrinsic capacitance caused by the larger area. So the transistor should be large but not too large. Hence, an optimum exists for both 1/f noise and white noise.

This example shows the noise from a source follower stage but exactly the same argumentation and tradeoffs apply for any CMOS preamplifier coupled to a capacitive signal source.

Figure 1:
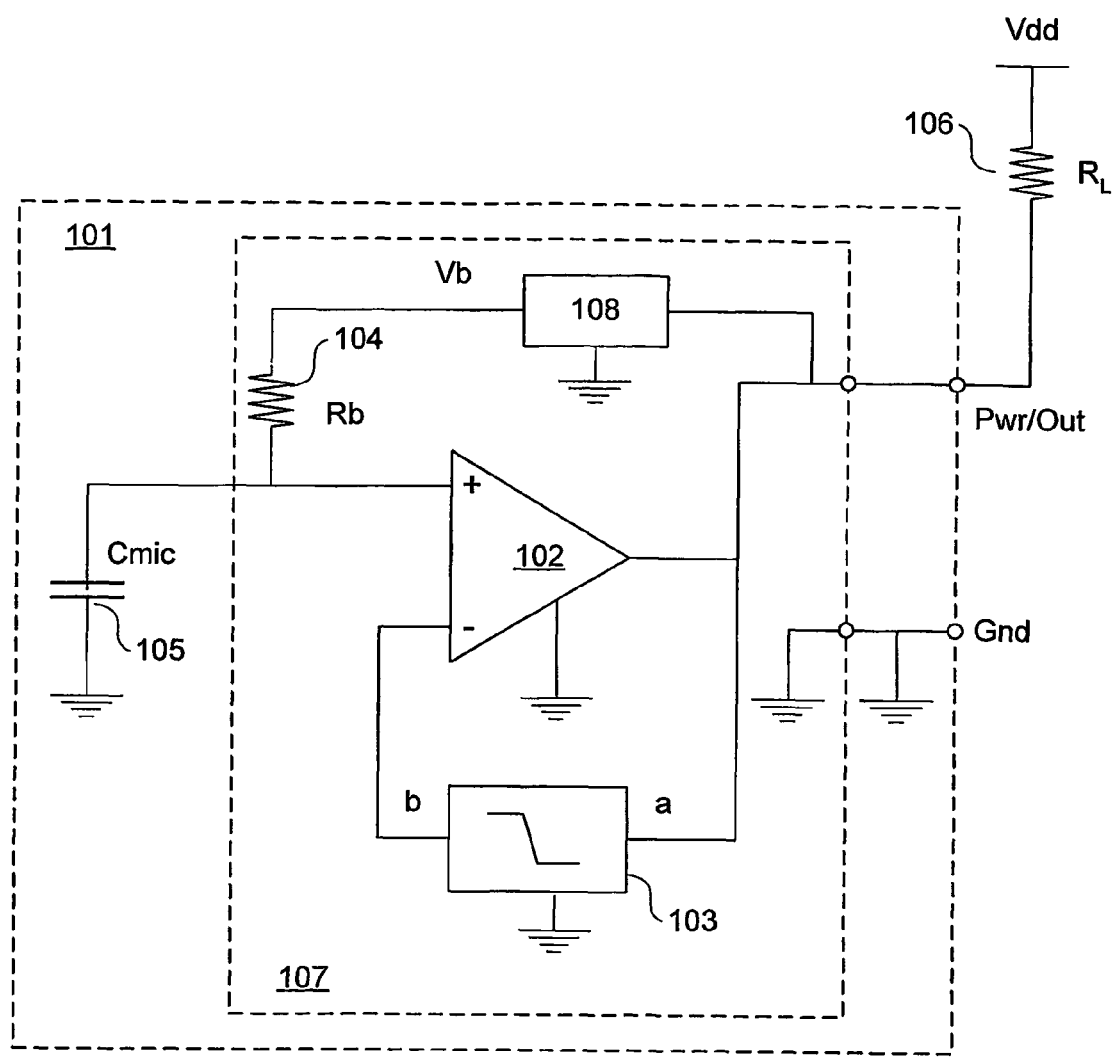
FIG. 1 shows a microphone comprising a preamplifier with a feedback filter.
Figure 4:
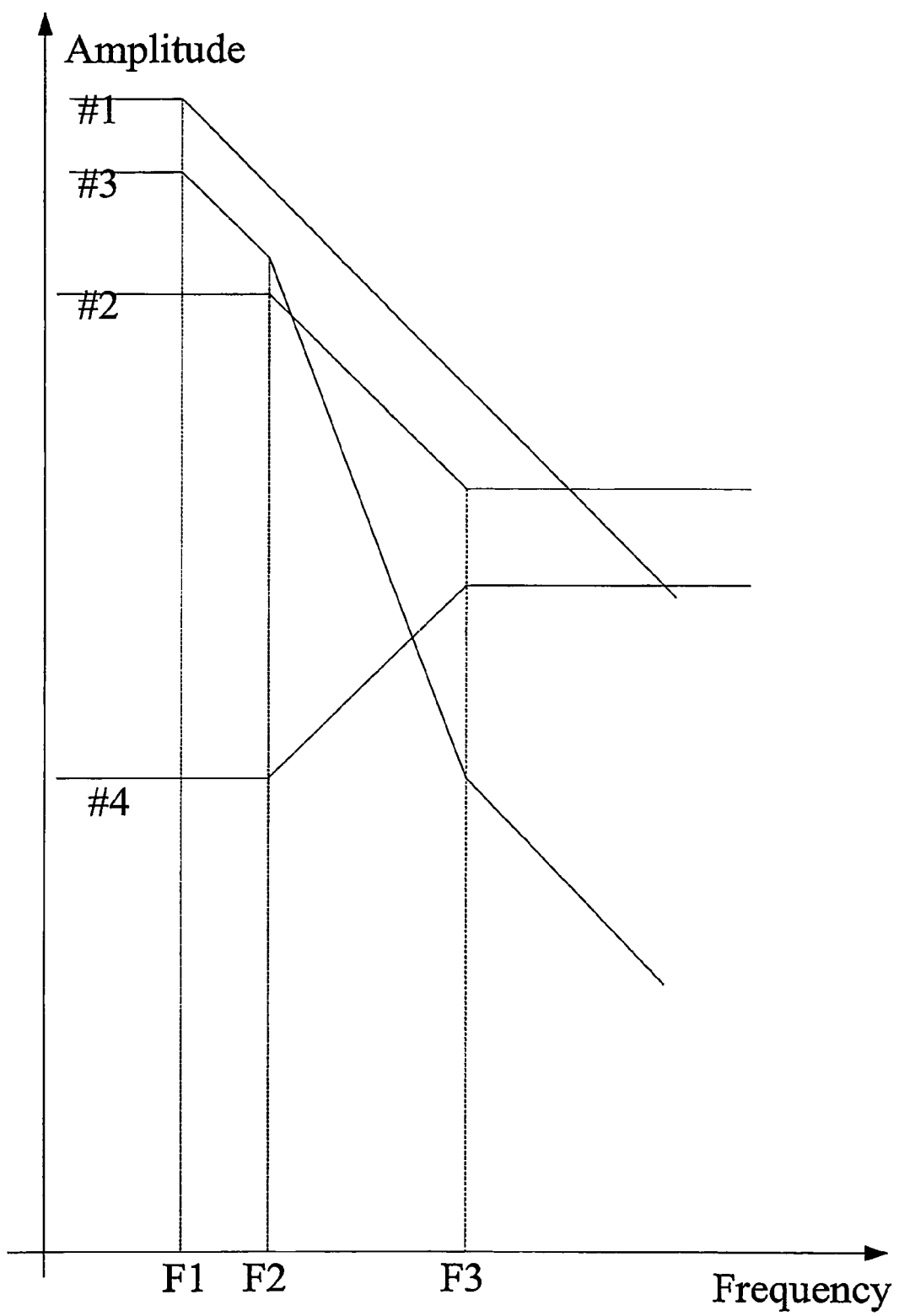
FIG. 4 shows plots of the transfer function for open loop amplifier gain, feedback filter gain, loop gain and preamplifier gain.

FIG. 4 shows plots of the transfer function for open loop amplifier gain, feedback filter gain, loop gain and preamplifier gain. The plots refer to a circuit configuration shown in FIG. 1, especially the feedback preamplifier comprising the amplifier 102 provided with the feedback filter 103 to establish a feedback loop. The open loop amplifier gain is illustrated by the curve designated #1, feedback filter gain is illustrated by the curve designated #2, the loop gain is illustrated by the curve designated #3 and the overall preamplifier gain is illustrated by the curve designated #4.

The plots serves to illustrate the principle of a preamplifier with a feedback filter from a gain-frequency domain point of view. The plots are shown for a first order filter configuration. Corresponding plots can be obtained for higher order filter configurations.

The open-loop amplifier gain, curve #1, is the well-known dominating pole type with a single dominating pole located at frequency F1 and with a very large gain at low frequencies.

The feedback filter characteristic, curve #2, comprises in its simplest first order form one pole and one zero. The pole being located at a frequency, F2, lower than the frequency, F3, of the zero. Basically, the filter has a lower frequency region and a higher frequency region with a lower gain than the low frequency region. Thus, the feedback filter characteristic shows a relatively high gain level below F2 and thus below a transition frequency range between F2 and F3 and a relatively low gain level above the transition frequency range i.e. above F3.

In practical implementations the preamplifier has a transfer function, in the frequency domain, with a zero and a pole cf. curve #2; wherein the pole is located in the range 0.1 Hz to 50 Hz or alternatively 0.1 Hz to 100 Hz or alternatively 0.1 to 200 Hz.

The combination of the open-loop gain and the feedback filter characteristic provides the loop-gain characteristic, curve #3. It can be seen that the loop-gain is very large below frequency F2.

The overall gain transfer function of the amplifier in a feedback configuration is shown by curve #4. Where the feedback configuration is established by means the feedback filter with a gain characteristic as shown in curve #2.

Figure 5A:
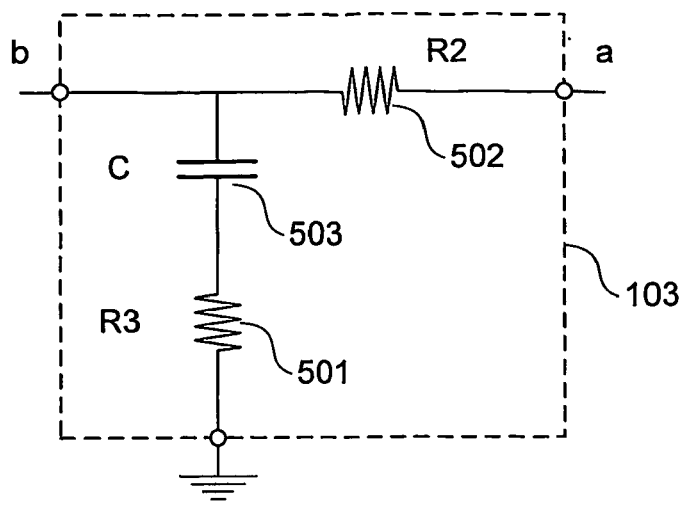
FIG. 5a shows a first feed-back filter.

FIG. 5a shows a first feedback filter. The feedback filter 103 forms a feedback circuit with an input port designated 'a' and an output port designated 'b'. The input port, a, is connected to a ground reference via a series connection of a first resistor R2, 502; a capacitor C, 503; and a second resistor R3, 501. The output port, b, is coupled to the circuit node formed by the interconnection of the first resistor R, 502 and the capacitor C, 503.

The feedback filter can be implemented in many ways but not all of them are equally easy to integrate on a chip. Especially filter types with series resistors are difficult to implement as the component values needed are difficultly implemented on a chip or semiconductor substrate.

The desired filter transfer function is a high-pass filter function. This is typically implemented using two resistors in series with a capacitor (see FIG. 5a). At lower frequencies the transfer function from port a to port b is close to one and at higher frequencies it is determined by the ratio of R2 and R3. In order to obtain low noise the resistors will have to be in the kOhm range and thus requiring the capacitor value to be nF range to realize a desired cut-off frequency. Capacitors in the nF range would require excessive chip area, and such solutions are thus deemed not possible for a chip implementation.

Figure 5B:
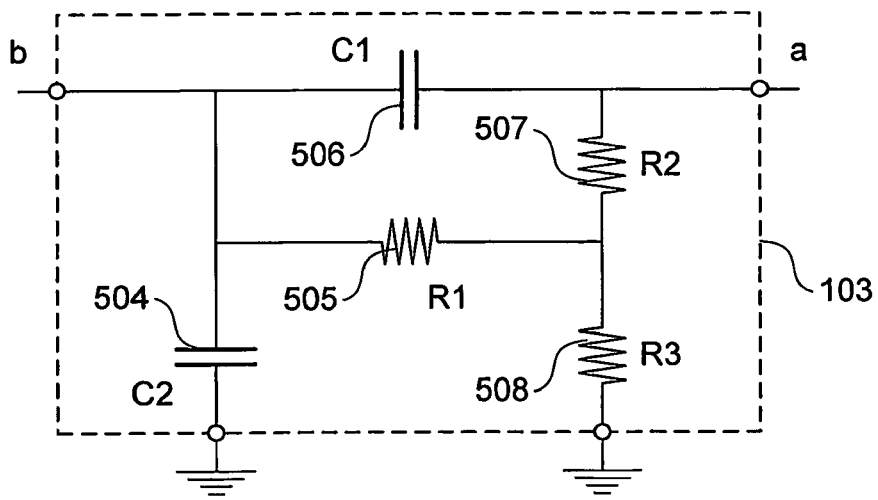
FIG. 5b shows a second feed-back filter for IC implementation.

FIG. 5b shows a second feed-back filter for IC implementation. The feedback filter 103 forms a feedback circuit with an input port designated 'a' and an output port designated 'b'. The filter has a configuration with an input port, a, connected to a series connection of a first resistor R2, 507 and a second resistor R3, 508 which forms a resistor node at their interconnection. The input port is also connected to a series connection of a first capacitor C1, 506 and second capacitor C2, 504 which forms a capacitor node at their interconnection. The capacitor node forms the output port. Additionally, the resistor node and capacitor node are interconnected by a resistor R1, 505.

For this configuration of the feed-back filter, the low frequency transfer function from port a to port b is determined by the two resistors R2, 507 and R3, 508. The high frequency transfer function is determined by C1, 506 and C2, 504. The cut-off frequency of the filter can be set by R1, 505. If R1, 505 is chosen very large, the noise of the filter will moved to very low frequencies and the audio band noise can thus be minimized without using excessively large capacitor values. Suitable ranges for implementation on a semiconductor substrate are C1=1-500 pF, C2=1-500 pF and R1=GOhm–Tohm.

Figure 5C:
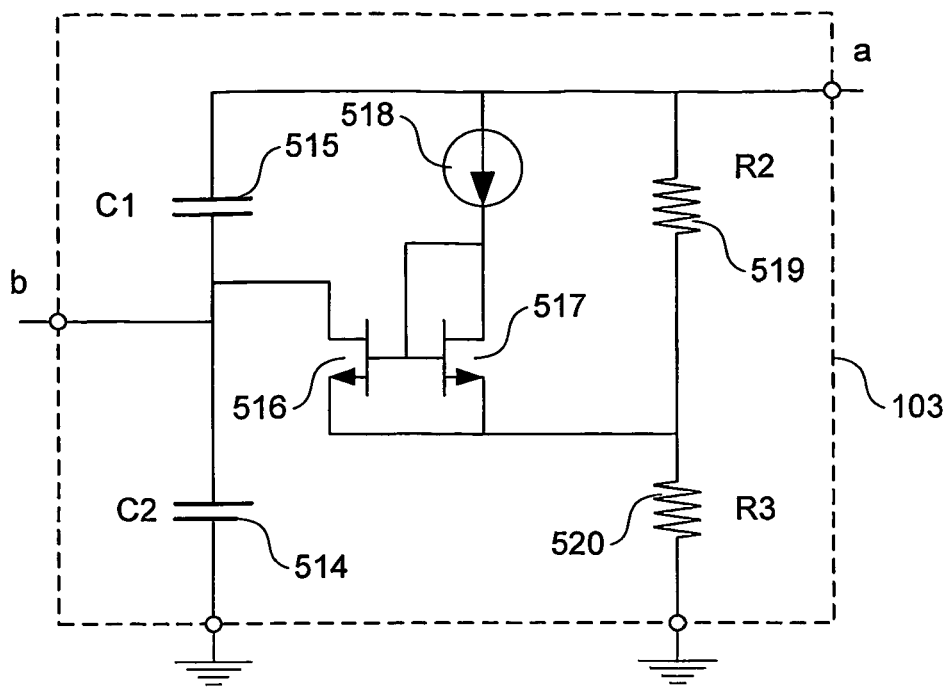
FIG. 5c shows a fourth feed-back filter for IC implementation.

FIG. 5c shows a fourth feed-back filter for IC implementation. The feedback filter 103 forms a feedback circuit with an input port designated 'a' and an output port designated 'b'.

The filter has a configuration with an input port, a, connected to a series connection of a first resistor R2, 507 and a second resistor R3, 508 which forms a resistor node at their interconnection. The input port is also connected to a series connection of a first capacitor C1, 506 and second capacitor C2, 504 which forms a capacitor node at their interconnection. The capacitor node forms the output port. Additionally, the resistor node and capacitor node are interconnected by an active device 516 which provides ohmic impedance across a two-port circuit. The two-port circuit comprises the active CMOS devices, or other type of active devices, 516 and 517, and a current source 518. The active devices comprise a respective gate terminal, a source terminal and a drain terminal. The gate terminals are interconnected at a node connected to the current source 518 and the drain terminal of the first device 517. The source terminals of the devices are interconnected, to provide the second device 516 in a state where an ohmic resistance is provided between its drain and source terminal. This drain and source terminal constitutes the two-port ohmic impedance. Cf. the description above, the cut-off frequency of the filter 103 is set by the ohmic impedance of the two-port circuit 516, 516 and 518.

With respect to the two-port circuit, a MOS transistor in the triode region is biased to have impedance in the G ohms region is a good solution. It can be fairly well controlled and easily implemented in any CMOS technology.

In our case a NMOS device will prove most sufficient because of the DC operating levels. But in other case also PMOS devices can be used and even symmetrical devices made by a combination of NMOS and PMOS devices can be used. But it depends on the DC levels if completely symmetrical device can be used.

The only disadvantage of the non-symmetrical NMOS resistor is that it is nonlinear thus it will generate a low frequency signal (i.e. a dc offset) when exposed to a large sinus. The amplitude of the low frequency signal generated by the NMOS resistor will be highly dependent on how the feedback filter is constructed. I.e. if the feedback factor of the capacitive feedback and the feedback factor of the resistive feedback are equal then the signal across the NMOS resistor will be zero and thus the generated low frequency signal will also be zero. But as argued earlier a large DC gain of the preamplifier will be a problem as large low frequency signals will be present at the input of the preamplifier and thus overload the preamplifier. A DC feedback factor giving a DC gain of two will effectively reduce the signal across the NMOS resistor by a factor of two and thus reduce the low frequency generated signal by at least a factor of two. However, DC gains in the range of one to five (1-5) will typically be suitable. That is, signals generated due to non-linear signal processing depends typically on the square of the generating signal or on the cubic of the generating signal. So halving the signal across the NMOS resistor will reduce the generated signal by a factor of four.

Thereby a way of implementing a resistor in the Giga-ohms range which can be relatively well controlled is provided. Ordinary use of diodes, diode coupled MOS transistors etc. can implement extremely large resistor values (in the order of Tera-ohms). However, these values are in fact too large for the purpose related to the IC implemented preamplifier.

Figure 5D:
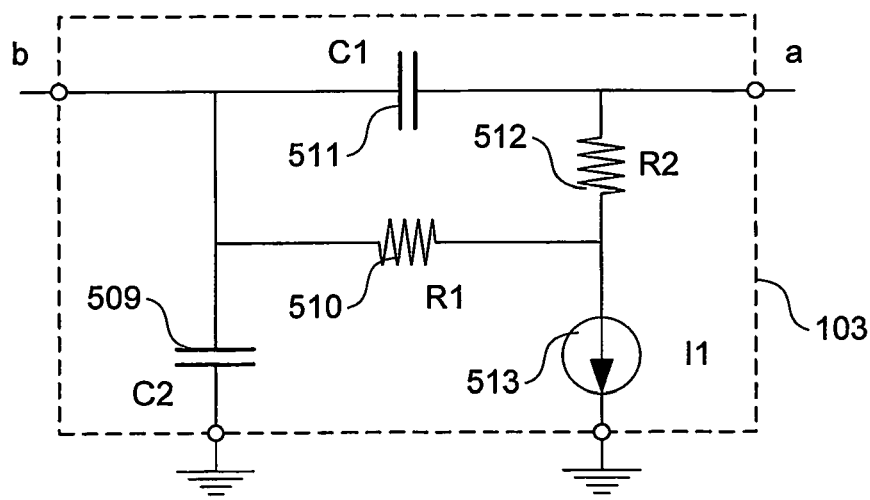
FIG. 5d shows a third feed-back filter for IC implementation.

FIG. 5d shows a third feed-back filter for IC implementation. In this embodiment, a DC offset has been build into the feedback filter 103. Thereby it is possible to compensate for undesired DC levels that arise due to leak currents. The DC offset is implemented by replacing the resistor R3 with a current source 513.

The total noise power from the filter 103 at the output port b (and thus at the inverting input of the amplifier 102) can be calculated to be KT/C where C is the total capacitance, K is Boltzman's constant and T is the temperature in Kelvin.

The noise can as such not be minimized without increasing the capacitors (C1 and C2) and this has the consequence that the area of the chip will be increased. This is not a feasible solution when a low cost solution is needed. However, the noise power can be moved or shaped to appear at lower frequencies by increasing the resistor value R1. In this way the noise from the resistive feedback network is filtered and the noise from the capacitors C1 and C2 (in fact the noise comes from R1) will be filtered and located at such low frequencies that the normally used A-weighting function will suppress the noise. So this solution has both low area and low noise.

The resistor R1 should be large in order to get low noise for the smallest possible area. But if the resistor is too large, the amplifier will settle to slowly after a power on or after an overload. This will significantly degrade performance of the amplifier for a longer period of time.

Figure 6:
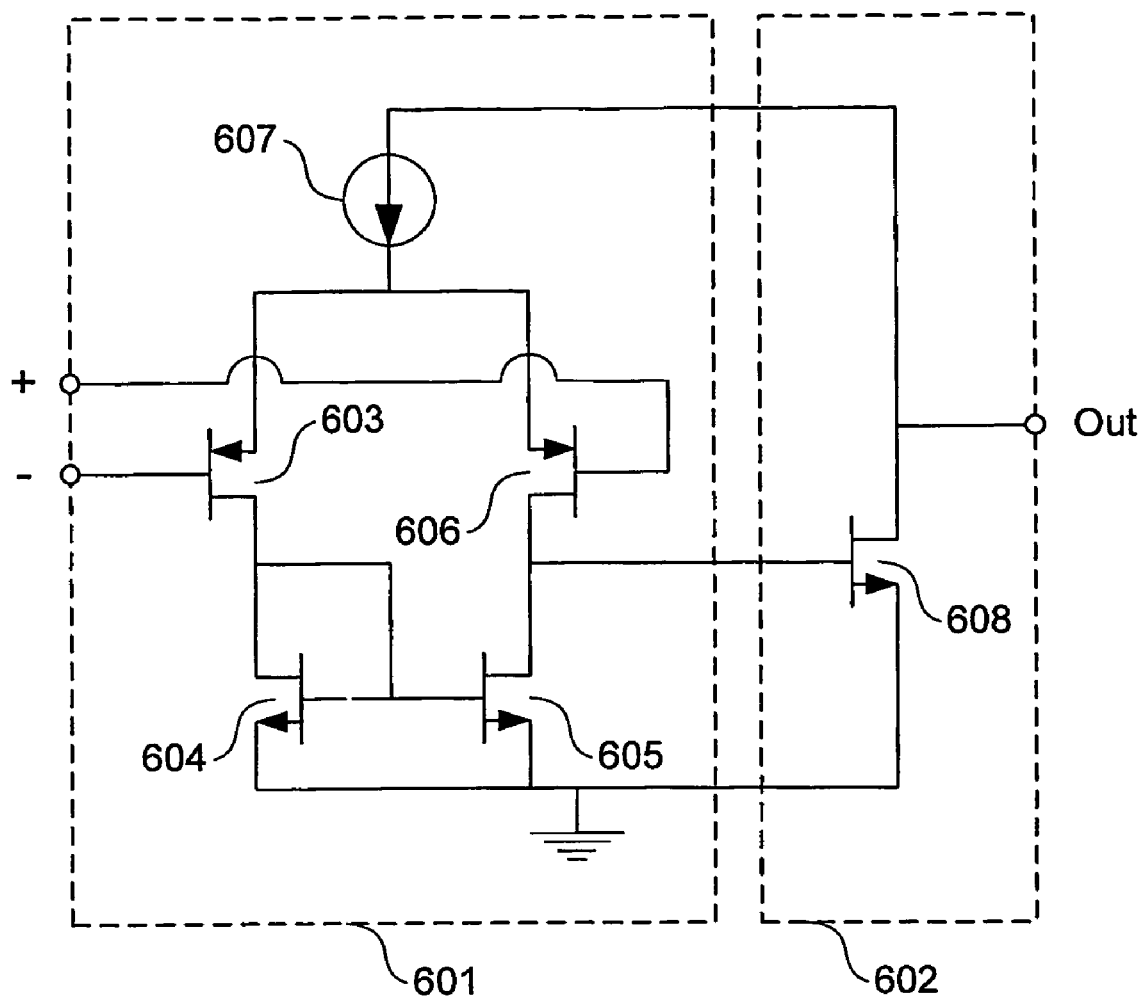
FIG. 6 shows a detailed view of an amplifier.

FIG. 6 shows a detailed view of the amplifier. The amplifier input stage 601 comprises a differential pair of PMOS devices 603, 606. This differential pair will have to be optimized in both width and length as an optimum for 1/f noise and white noise exists (see FIG. 3). If needed, an offset can be built into the differential pair by adjusting the aspect ratio of the two transistors in the differential pair (see FIG. 10d). Alternatively or additionally, the mirroring factor of the current mirror 604, 605 in the bottom can be adjusted. If the ratio between the aspect ratio of the differential pair transistors are A and the current mirror factor is B, the offset of the amplifier will be $n*Vt*\ln(A*B)$.

Various implementations of a differential input stage exist—for instance, the NMOS current mirror 604, 605 can be replaced by a so-called folded cascode in combination with a PMOS current mirror.

At the output stage 602 of the amplifier, an output transistor 608 is connected to the high impedent gain node. The function of this is to ad gain and to isolate the high impedant node from the outside. Notice that the only device which has a varying current is the output transistor. Thereby the other transistors are biased by constant current sources.

Thus, a principle amplifier with a differential input stage and an output stage is described.

FIG. 7a shows an amplifier with a feed-back filter and an input clamping circuit. The input clamping circuit 701 is connected to the input of the amplifier receiving the microphone signal (in this case the non-inverting input). Which clamping circuit to use depends on availability of technology and demands.

FIG. 7b shows a diode based input clamping circuit. This circuit is commonly known and has proven to work well. It consists of two cross coupled diodes. The impedance/resistance around zero biasing is very high and at typically 400 mV-600 mV the device starts to clamp the signal—i.e. the impedance drops dramatically. The impedance is very high at zero biasing and it clamps the signal for large signal levels as it should. The impedance may however be too large for some circuits (examples of up to 100 Tohms has been measured) and the clamping of the signal happens very often at too low signal levels.

In that case the two following solutions might prove better. It is possible to make new symmetrical high impedant devices by combining any of the three implementations.

FIG. 7c shows a PMOS based input clamping circuit. This implementation is basically an implementation of two cross-coupled diodes using MOS devices 704, 705 instead.

FIG. 7d shows a NPN transistor based input clamping circuit. This implementation is basically an implementation of two cross-coupled diodes using bipolar devices 706, 707 instead.

FIG. 8a shows an amplifier with a feed-back filter and an output stage. The output stage 802 is part of the complete preamplifier and is embedded in a feedback loop comprising amplifier 801, the output stage 802 and the feedback filter 103. The purpose of the output stage 802 is to isolate the internal circuit nodes of the preamplifier from the load coupled to the output terminal V1/out.

FIG. 8b shows a common source output stage. The first example is a common source stage with a miller compensation capacitor 805 and a resistor 804 for right half-plane zero compensation. This stage has the advantage that the output swing can be very large, the DC gain is large and frequency compensation is very easy to implement. The disadvantage is that parameters varies much with the load and the output swing. That is, if the load is resistive then the current will vary both with load and the output swing. This has the consequence that the miller compensation will have to be designed for worst case conditions and parameters such as distortion PSR etc. will vary much with load and signal swing.

FIG. 8c shows a source follower output stage. The second example is a source follower stage based on an active device 806. This effectively isolates the internal circuit nodes from the load and the all the parameters are very stable both with varying load and output swing. The disadvantage with the source follower stage is that frequency compensation requires large capacitors and that the output swing is limited compared to the common source stage.

Figure 8D:
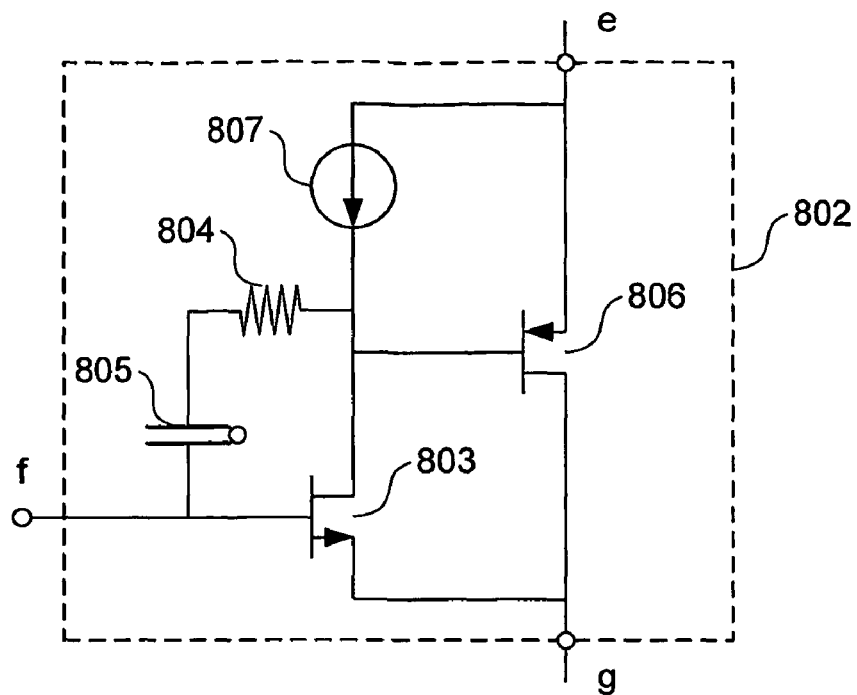
FIG. 8d shows an output stage with a combined common source and source follower configuration.

FIG. 8d shows an output stage with a combined common source and source follower configuration. The third example is the combination of the common source stage and the source follower. This enables both easy frequency compensation and stable performance. The only disadvantage is the limited output swing compared to the simple common source stage.

Figure 8E:
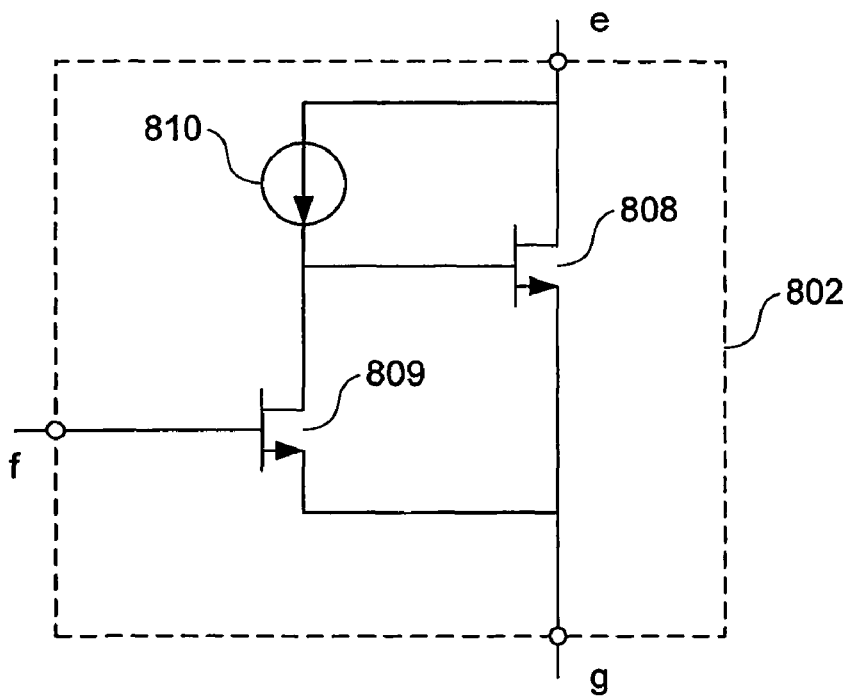
FIG. 8e shows a cascaded common source output stage.

FIG. 8e shows a cascaded common source output stage. The fourth example is two common source stages in series, where the active device of the first stage is biased by a current source 810. In this case so-called nested miller compensation has to be used. This solution has more stable performance than the simple common source stage but not as stable as the combination of a common source stage and a source follower. But the output swing is just as good as the simple common source stage.

Figure 9:
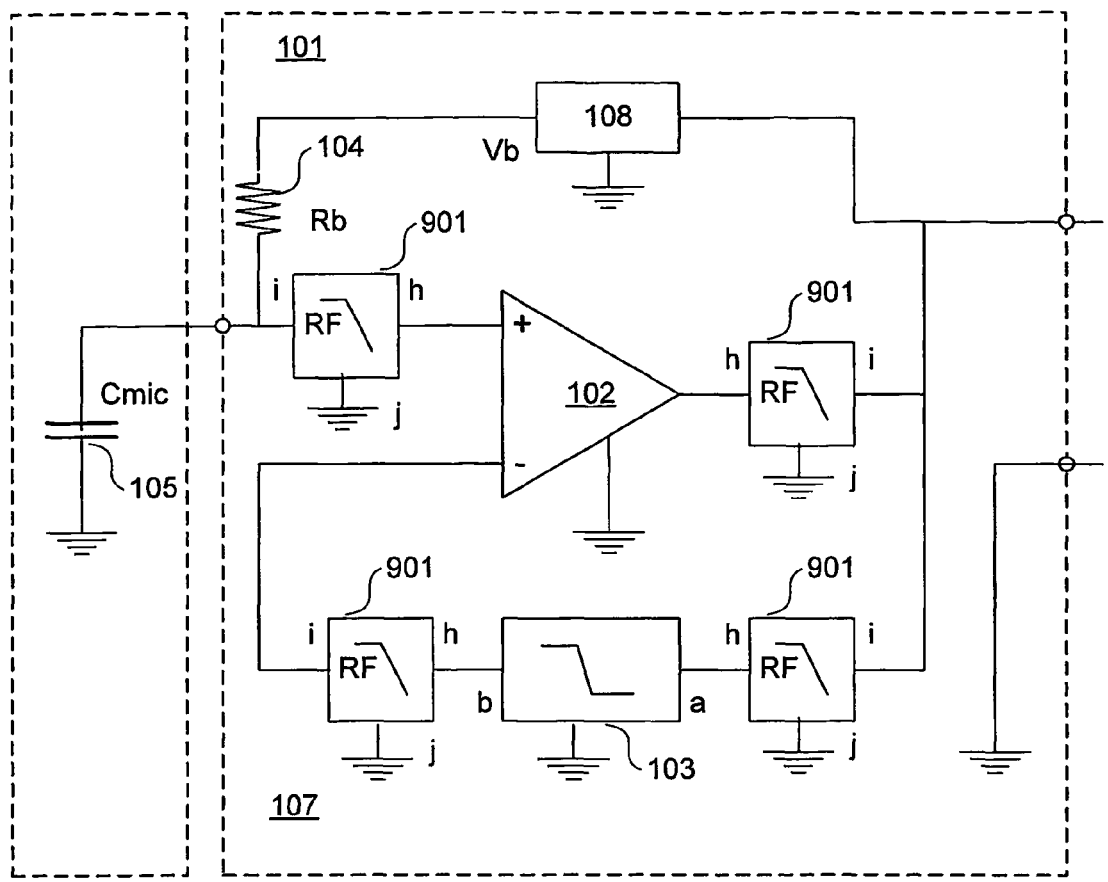
FIG. 9 shows an amplifier configuration with RF filters.
Figure 9:
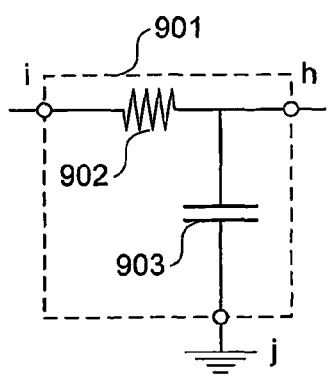

FIG. 9 shows the preamplifier with RF filters implemented. The Radio Frequency, RF, filters 901 comprise a capacitor 903 and a resistor 902 coupled to receive an input signal at their interconnection at the circuit node designated port 'h' and to provide an output signal at port 'i'. A ground reference is provided at port 'j'. Thereby a first order low-pass filter diminishing RF signals is provided. However, other higher order filters can be used—e.g. $2^{nd}$, $3^{rd}$, and $4^{th}$ order filters.

With today's widespread use of mobile phones, microphones are exposed for very power-full high frequency signals e.g. the RF GSM signal of a mobile phone. And especially a microphone for a mobile is exposed to very large RF signals as it is located very close to the antenna. It is well know that nonlinearities in semiconductors can inter-modulate low frequency variation of RF signals into the low frequency bandwidth. To exemplify this, a GSM phone is transmitting at periods of 217 Hz. If by example a diode is exposed to a GSM signal then the nonlinearity of the diode together with the GSM signal will create a very power-full 217 Hz component and harmonics of this. One of the most efficient ways of reducing this problem is simply to prevent the GSM signal from reaching the nonlinear semiconductor components. This can be implemented by adding RF filters 901 on every connection pad for the amplifier ASIC.

This approach is very effective but the problem is that these filters beside filtering the RF noise, also affect the performance of the amplifier. That is, output impedances increase, noise levels increase etc. But in the case of a feedback amplifier this problem is greatly reduced as the overall performance of the amplifier is greatly determined by the feedback filter and by the input stage. So if the high frequency components can be prevented from accessing the input stage, the feedback loop will by itself suppress low frequency inter-modulated signals introduced elsewhere in the amplifier. Due to, typically, a high open loop gain, the amplifier will have a performance which is unaffected even though very effective RF filters are added to the output pads/connections.

Also on the input side, RF filters can be added, but here the noise of these are not suppressed by the loop gain. But as the overall amplifier structure has lower noise, this can be traded off for a more effective RF filter on the input.

Figure 10A:
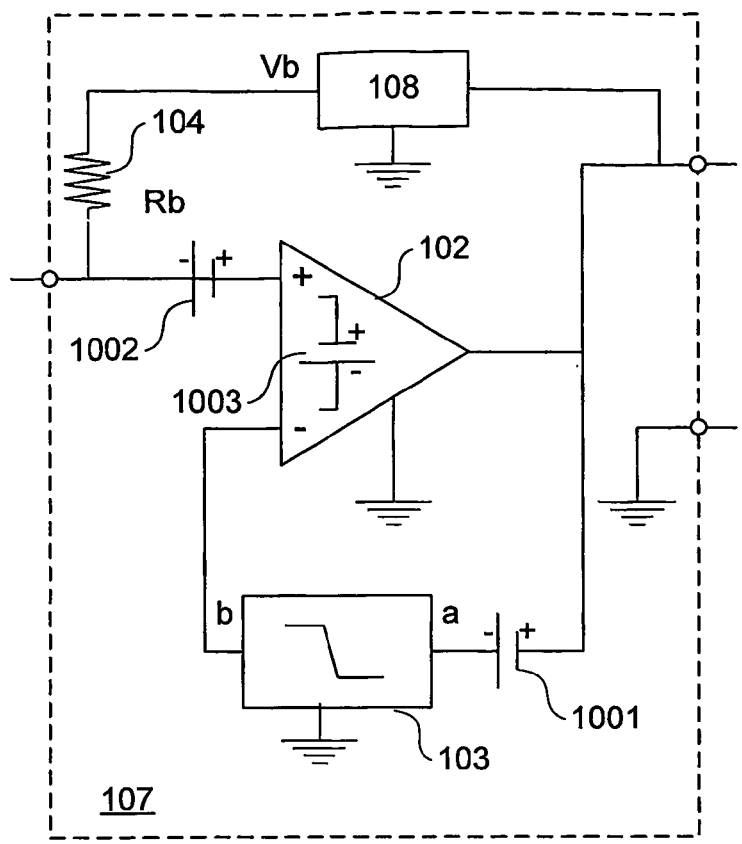
FIG. 10a shows an amplifier configuration with DC level compensation within the feed-back filter and within the input stage of the amplifier.

FIG. 10a shows a preamplifier and feedback filter with DC offsets implemented. The purpose of the DC offsets 1001, 1002 and 1003 is to set the DC bias voltage of the output of the amplifier. A DC offset implemented in the amplifier will be amplified by the DC closed loop gain of the amplifier thus setting the output DC level of the amplifier. In order to handle low-frequency signals and external offsets on the input the DC offset of the amplifier will have to be designed for a fairly large value. Which can be a problem when optimizing for lowest possible noise. And also when optimizing for lowest possible chip area—i.e. lowest cost.

More optimal is it to implement the offset in or just after the FB-filter. In this way the offset will not be multiplied by the DC closed loop gain of the amplifier and also the amplifier can be designed for lower noise without increasing the chip area. It can though be a problem to implement all off the offsets in the filter so a combination of an offset in the amplifier and an offset in the feedback filter will normally prove to be optimal.

Figure 10B:
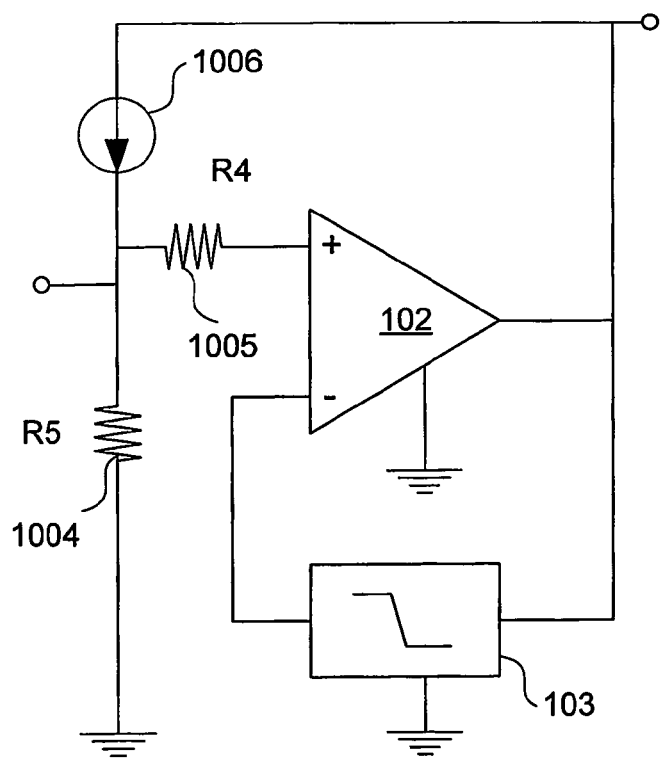
FIG. 10b shows an amplifier configuration with DC level compensation at the input terminal of the amplifier.

FIG. 10b shows an amplifier configuration with DC level compensation at the input terminal of the amplifier. A current source 1006 provides a DC current through a resistor R5, 1004. The DC voltage level provided over the resistor R5, 1004 will shift the DC level at the input of the amplifier 102.

There are basically two ways of implementing an offset at the input of the preamplifier. The first one is provided by a reference voltage source filtered by a large resistor. The resistor can be implemented in many ways. I.e. as diodes active devices etc.

The second one is offset implemented in the input differential pair. This can be done in many ways e.g. with a deliberate mismatch in currents or sizes of in the input differential pairs as sketched in FIG. 10d. Alternatively, the DC offset can be provided by a device with a DC offset in series with one of the sources.

Figure 10D:
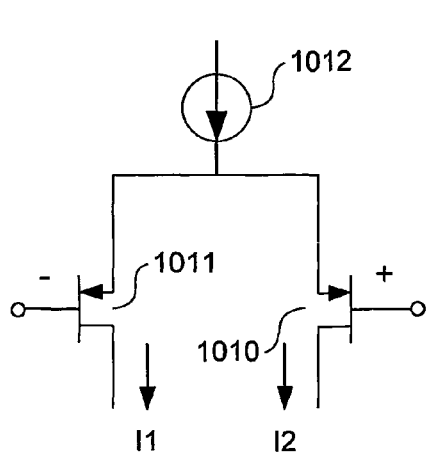
FIG. 10d shows an amplifier configuration with DC level compensation at the input stage of the amplifier.
Figure 10C:
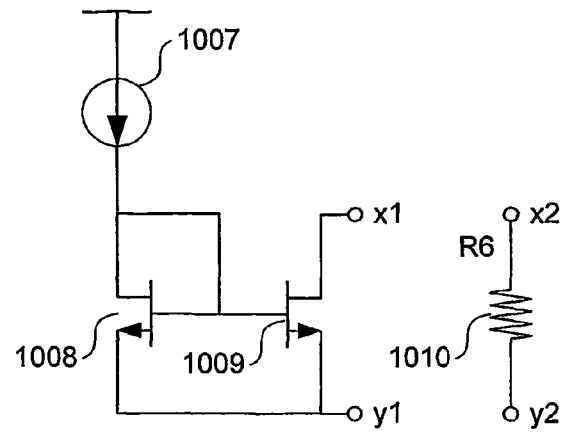
FIG. 10c shows a circuit which implements a high-ohmic resistor.

FIG. 10c shows a circuit which implements a high-ohmic resistor. Apart from diodes transistors etc. also active devices can be used as high resistive devices. A NMOS device 1009 biased in weak inversion will have an ohmic resistance between drain and source at port x1 and y1, respectively, approximately equal to $A \times nVt/Id$, where a is the ratio between the two transistor aspect ratios. Id is the current in the bias transistor, $nVt=39$ mV for most CMOS processes. The NMOS device 1009 is biased in weak inversion by means of a NMOS device 1008 biased by a current source 1009.

Thus, the active device 1009 is forced to be in a state, where a high ohmic impedance is provided between its source and drain terminal. An ohmic impedance larger than 50 MOhm or larger than 100 MOhm or larger than 500 MOhm is provided. Alternative embodiments using poly-diode configurations are generally not preferred due to its specific implementation semiconductor technology.

In this way Giga-ohm resistors can be implemented using CMOS devices. The disadvantage of this device is that it is asymmetrical. This can be somewhat compensated adding a symmetrical device across the NMOS resistor.

FIG. 10*d* shows a sketch of an input stage of a differential amplifier configuration with DC level compensation at the input stage. The DC level compensation is obtained by providing a difference between the currents I1 and I2 flowing through the differential pair comprised by transistors 1011 and 1010, respectively. The current source 1012 illustrates biasing of the differential pair.

Figure 11:
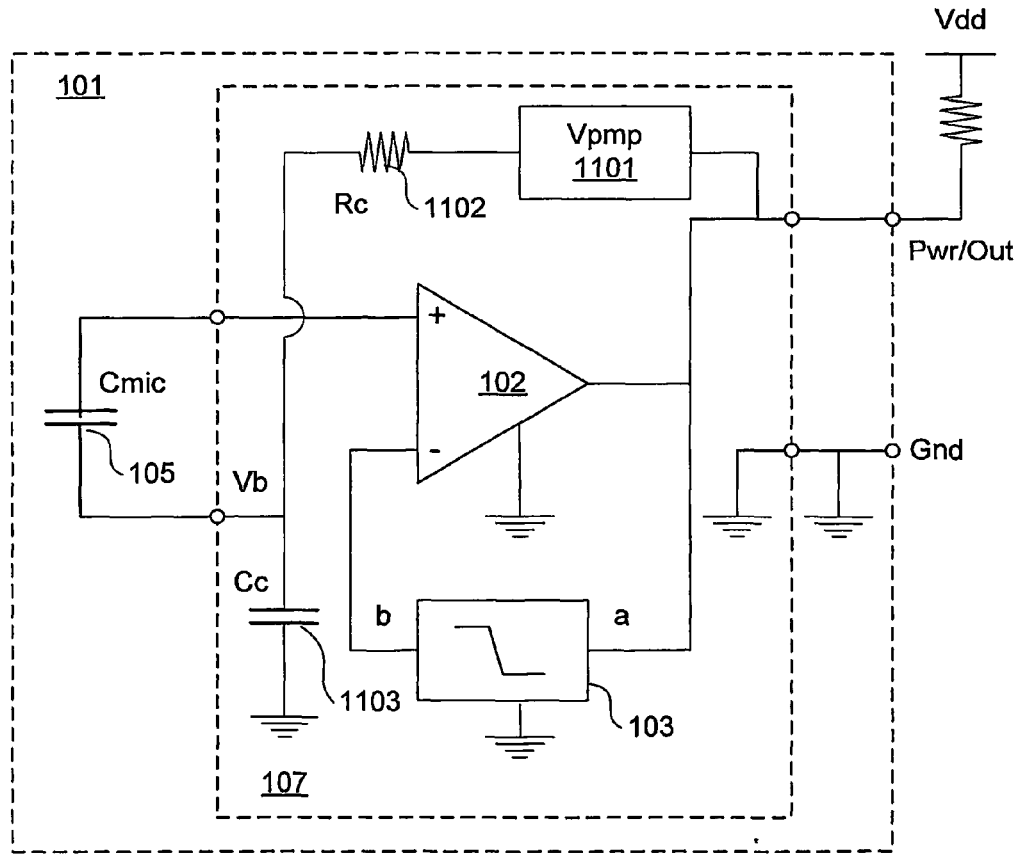
FIG. 11 shows an amplifier configuration with a voltage pump.

FIG. 11 shows the amplifier in a configuration with a voltage pump. A voltage pump Vpmp, 1101 is typically needed when there is no charged electret layer in the microphone as in e.g. a silicon microphone. The voltage pump Vpmp, 1101 provides a pumped voltage as a bias voltage Vb via the resistor Rc, 1102. A capacitor Cc operates together with the resistor Rc to decouple noise.

When there is no electret layer in the microphone, an external bias is needed and can be supplied by a voltage pump integrated on the same semiconductor substrate as the preamplifier. Voltage pumps are normally quite noisy and thus a decoupling filter is needed. This filter can consist of a decoupling capacitor Cc and a large resistor, Rc. To decouple the noise of the voltage pump 1101, a filter with a very low cut-off frequency is needed. And thus it settles very slowly during power up. That is, a very large low frequent signal will be present on the input of the amplifier for a substantial period of time. So, the preamplifier with a low gain at low frequencies again proves to be very beneficial.

Some microphone types requires a bias voltage in order to function e.g. silicon microphones. Such as bias voltage is normally higher than the supply voltage. In fact in can be as high as 30V and thus many times higher than the power supply. Such a bias voltage is generated using a voltage pump which typically is comprised by a Dickson pump and an oscillator to provide a clock signal to the Dickson pump. However, the clock signal can be provided an external oscillator—in which case a separate input terminal of the semiconductor substrate typically is needed.

If the microphone is biased at a high DC voltage, a DC coupling capacitance is needed between the amplifier and the microphone as then amplifier in nearly all cases are not able to handle the large DC level without overload. Furthermore by integrating everything on the same chip the total performance can be optimized giving the best possible performance.

Figure 12:
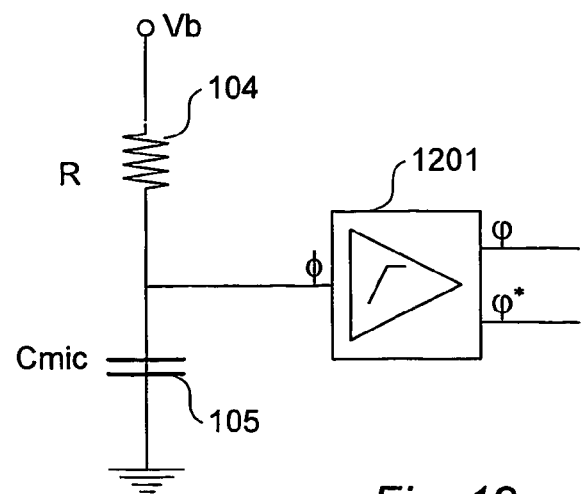
FIG. 12 shows a microphone comprising an electret microphone member and a differential amplifier with a feedback filter.

FIG. 12 shows a microphone comprising an electret microphone member and a differential amplifier. The electret microphone member is biased via a bias resistor 104 that is coupled to a bias voltage Vb. Thereby an electric charge is provided to the membrane or movable member of the microphone 105, Cmic. A signal provided in response to a sound pressure on the microphone and thus making the membrane move is provided to an amplifier 1201. The amplifier 101 is characterised by having a gain characteristic with relative low gain for frequencies below an audible range and a relative high gain for frequencies in the audible range. Preferably, the gain characteristic descents as a $1^{st}$, $2^{nd}$, $3^{rd}$, $4^{th}$, or higher order below the audible range. In addition thereto the amplifier is characterised by processing a low frequency microphone signal as a common-mode signal and a high frequency microphone signal as a differential mode signal. Thereby low frequency components are effectively suppressed. The differential output signal at terminals φ and φ* is provided as a microphone preamplifier output signal.

Figure 13A:
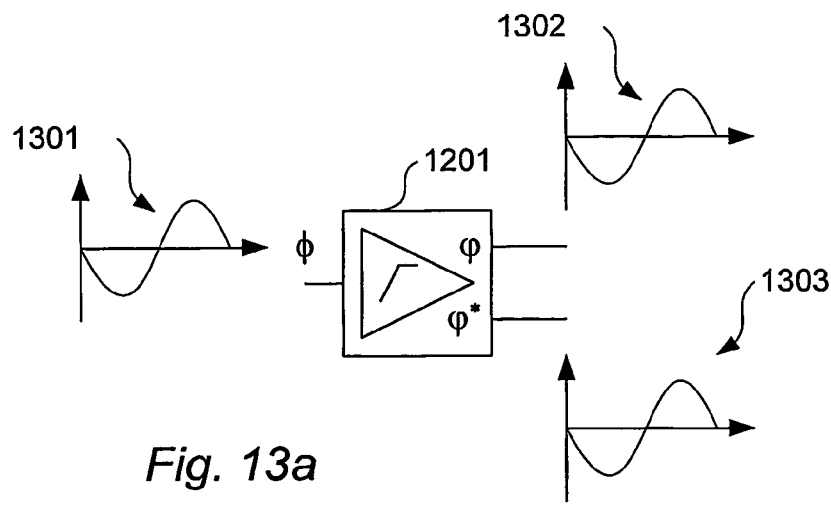
FIG. 13a shows a differential amplifier with input and output terminals and signals illustrating low frequency behaviour of the differential amplifier.

FIG. 13*a* shows a differential amplifier with input and output terminals and signals illustrating a low frequency behaviour of the differential amplifier. The signal processing of amplifier 101 at low frequencies is illustrated. The curve 201 illustrates a microphone signal in the time-domain input to the amplifier (φ) and at a low frequency. The curves 1302 and 1303 illustrates that respective outputs (φ, φ*) of the amplifier are substantial in phase and thus represent a common-mode differential signal.

Figure 13B:
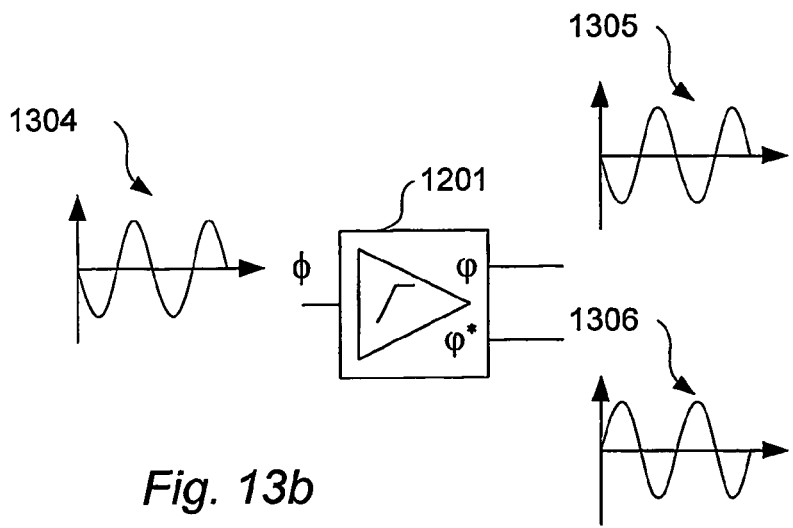
FIG. 13b shows the differential amplifier with input and output terminals and signals illustrating a high frequency behaviour of the differential amplifier.

FIG. 13*b* shows the differential amplifier with input and output terminals and signals illustrating a high frequency behaviour of the differential amplifier. The signal processing of amplifier 1201 at high, audio band, frequencies is illustrated. The curve 1301 illustrates a microphone signal in the time-domain input to the amplifier (φ) and at a audio frequency. The curves 1302 and 1303 illustrates that respective outputs (φ, φ*) of the amplifier are substantial 180 degrees out of phase and thus represent a differential-mode differential signal.

Figure 14:
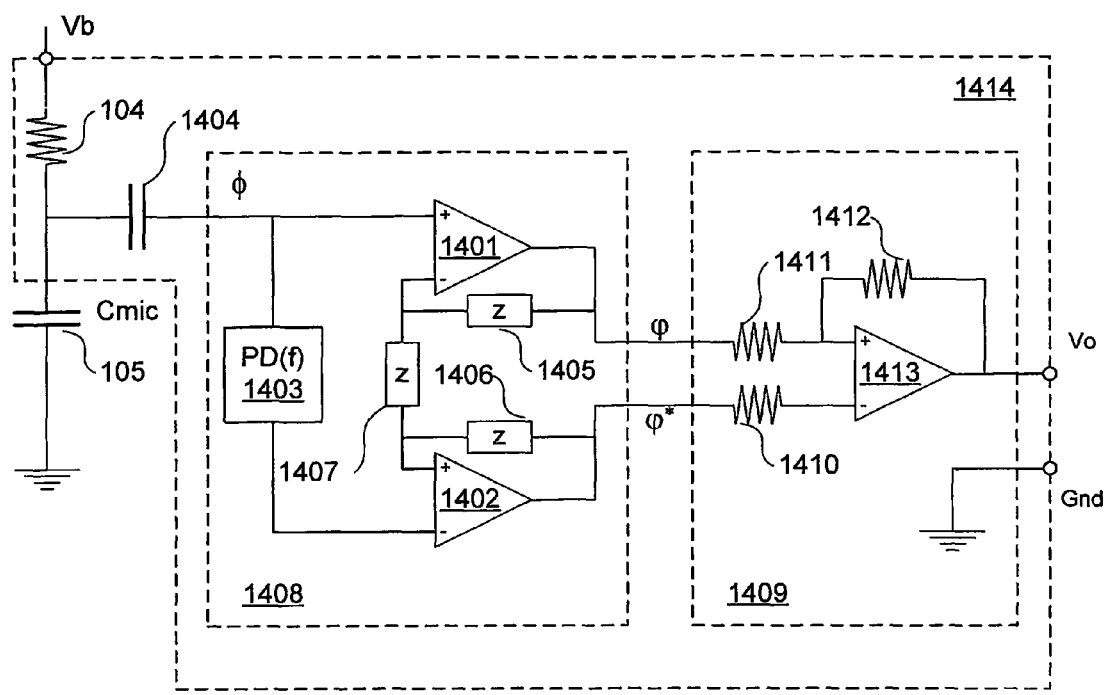
FIG. 14 shows a portion of a digital microphone comprising an electret microphone member and a differential amplifier in a first configuration.

FIG. 14 shows a portion of a digital microphone comprising an electret microphone member and a differential amplifier in a first configuration. The microphone Cmic, 105 provides a signal to the differential amplifier 1408 via a DC blocking capacitor 1404. The differential amplifier is coupled as an instrumental amplifier and comprises a first amplifier 1401 and a second amplifier 1402. A feedback circuit comprising components 1405, 1406 and 1407 implements a feedback filter with a characteristic as disclosed in the above. Additionally, a phase-shifter circuit PD(f), 1403 implements a frequency dependent phase delay to establish the signal processing explained in connection with FIG. 13*a* and FIG. 13*b*.

The two-terminal output (φ, φ*) of the differential amplifier is provided to a difference amplifier 1409 which by means of resistors 1410, 1411 and 1412 and operational amplifier 1413 provides a single-ended output signal Vo with respect to the ground reference, Gnd.

The amplifiers 1408 and 1409 can be implemented on a common semiconductor substrate, but the differential signal is preferably routed where the electrical environment is noisy e.g. from the chip carrying the preamplifier to another chip for further signal processing. At this other chip the differential signal can be converted to a single-ended signal by means of the amplifier 1409.

Figure 15:
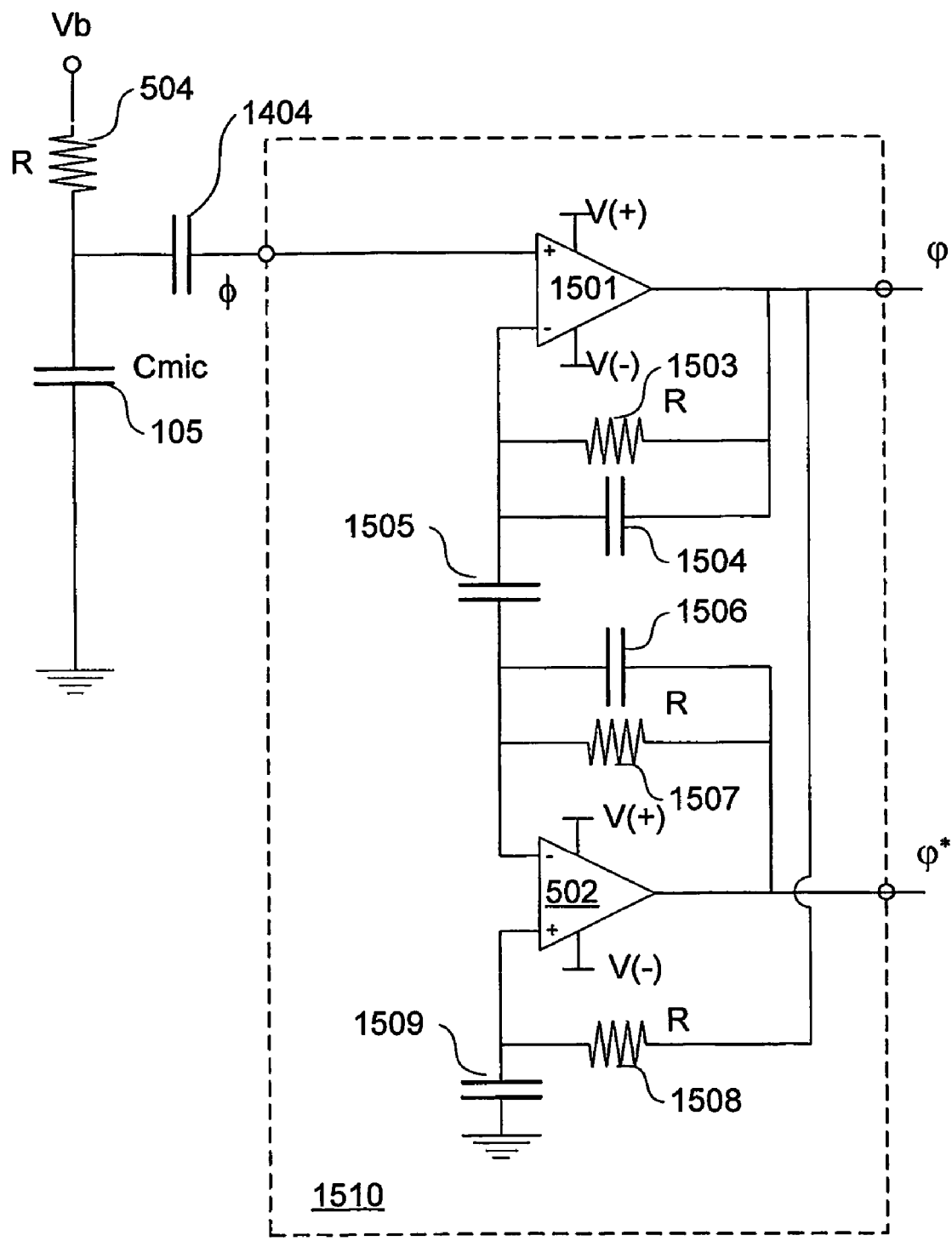
FIG. 15 shows a portion of a digital microphone comprising an electret microphone member and a differential amplifier in a second configuration.

FIG. 15 shows a portion of a digital microphone comprising an electret microphone member and a differential amplifier in a second configuration. The electret microphone member is biased via a bias resistor 104 that is coupled to a bias voltage Vb. Thereby an electric charge is provided to the membrane or movable member of the microphone Cmic, 105. In order to block the DC bias voltage, Vb, from the input of the differential amplifier 1510 a capacitor 1404 is applied. The differential amplifier 1510 is configured as a so-called instrumentation amplifier wherein two operational amplifiers 1501 and 1502 each are coupled with a feedback path from their respective outputs φ, φ* to their respective inverting input terminal. The inverting inputs (−) of the operational amplifiers are coupled together by means of a capacitor 1505. A non-inverting input of the one operational amplifier 1501 is coupled to receive the microphone signal via the DC-blocking capacitor 1404. A non-inverting input of the other operational amplifier 1502 is coupled to receive a feedback signal from the output φ of the other operational amplifier via a resistor 1508. The non-inverting input is also coupled to ground by means of a capacitor 1509.

The feedback path of the operational amplifier 1501 comprises a resistor 1503 and a capacitor 1504 coupled in parallel to constitute a first order filter. Likewise, the feedback path of the operational amplifier 1502 comprises a resistor 1507 and a capacitor 1506 coupled in parallel to constitute a first order filter.

The RC network comprising resistor 1508 and capacitor 1509 is configured to provide a frequency dependent phase shifting of the signal.

The phase shift between the one side, constituted around operational amplifier 1501, of the differential amplifier and the other side, constituted around operational amplifier 1502 is implemented partly by capacitor 1505 and partly by the RC filter 1508, 1509. Thus, the phase shift is obtained by a phase shifter, capacitor 1505, coupled between inputs of the differential amplifier and a phase shifter, capacitor 1509 and resistor 1508, cross coupled between an output of one side of the differential amplifier and an input of the opposite side of the differential amplifier. Thus, the effective phase shift is obtained by means of two phase shifters. However, one of such two coupled phase shifters may be sufficient to establish the effective phase shift. Likewise, other configurations of phase shifters can be embodied without departing from the scope of the invention.

Figure 16:
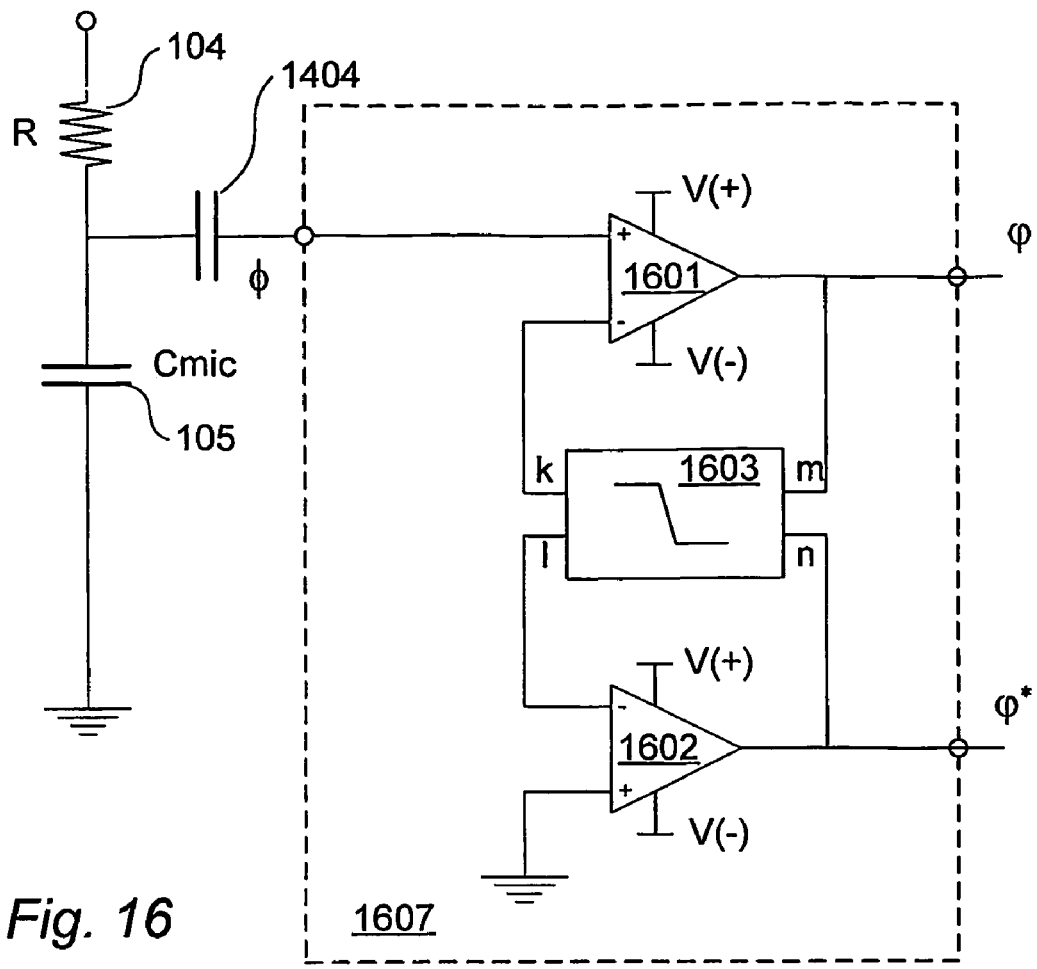
FIG. 16 shows a portion of a digital microphone comprising an electret microphone member and a differential amplifier with a feedback filter.

FIG. 16 shows a portion of a digital microphone comprising an electret microphone member and a differential amplifier with a feedback filter. In this illustration a differential amplifier 1607 with a first and a second operational amplifier is shown with a filter block 1603. The filter block 1603 implements feedback paths of the respective operational amplifiers and coupling of the inverting inputs of the respective operational amplifiers 1601 and 1602. The filter block comprises input ports m, n and output ports k, l.

The filter block can implement a filter with two feedback paths of any order e.g. a $1^{st}$ order, $2^{nd}$ order, $3^{rd}$ order, $4^{th}$ order or any higher order.

Figure 17:
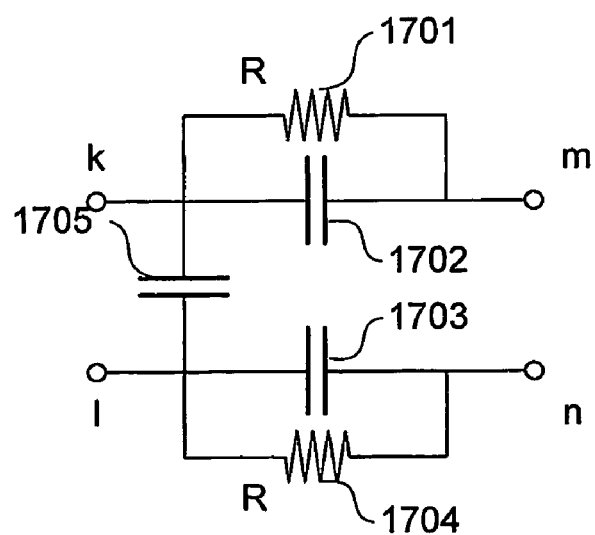
FIG. 17 shows a preferred embodiment of a feedback filter.

FIG. 17 shows a preferred embodiment of a feedback filter. The feedback filter can implement the filter block 1603 of FIG. 16. The feedback filter comprises a first path with resistor 1701 coupled in parallel with a capacitor 1702 and a second path with resistor 1704 coupled in parallel with a capacitor 1703. The first path extends between port m and k and the second path extends between port n and l.

Figure 18:
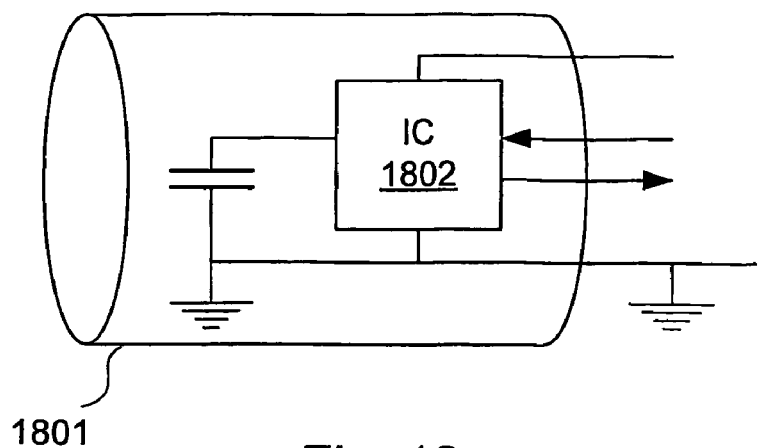
FIG. 18 is a schematic view of a microphone with an integrated circuit and a microphone member.

FIG. 18 is a schematic view of a microphone with an integrated circuit and a microphone member. The integrated circuit 1802 comprises the preamplifier as disclosed above and is embodied on a semiconductor substrate or a chip.

Figure 19:
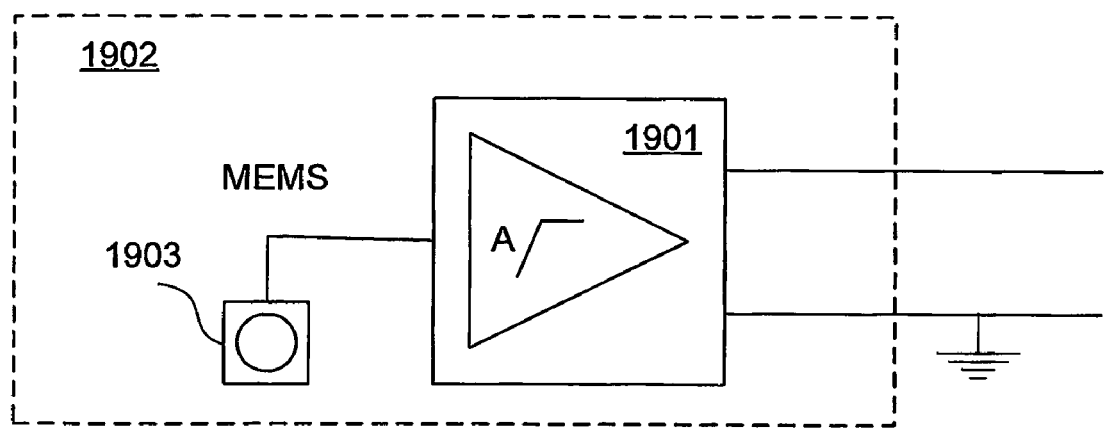
FIG. 19 is a schematic view of a microphone with an integrated circuit and a MEMS microphone member.

FIG. 19 is a schematic view of a microphone with an integrated circuit and a MEMS microphone member. The microphone 1902 comprises a MEMS microphone member 1903 integrated on a first substrate and the preamplifier circuitry 1901 integrated on a second substrate. The preamplifier circuitry comprises one of the different embodiments disclosed above i.e. comprising a preamplifier with a feedback circuit and .e.g. a voltage pump and/or a feedback circuit, where the preamplifier is a differential amplifier or a single-ended amplifier.

It should be noted that the MEMS microphone member 1903 and the microphone preamplifier 1901 can be integrated on a single semiconductor substrate.

Generally, it should be noted that embodiments of the invention may comprise one or more of the described features. For instance, the preamplifier may comprise one or more of the following features:

A DC offset in the preamplifier stage;
A DC offset in the feedback filter;
A DC offset in both the preamplifier stage and the feedback filter;
A voltage pump;
A voltage pump in combination with a DC offset;
A radio frequency, RF, filter coupled to the following circuit nodes:
   a non-inverting amplifier input; and/or
   an inverting amplifier input; and/or
   a filter input; and/or
   an amplifier output.
An input bias element.

It should be noted that the invention is not limited to the disclosed embodiments.

The above features may be applied in embodiments of a preamplifier configuration that comprises a gain stage with a feedback filter, where the configuration has a relatively low gain response for frequencies below an audio band and has a relatively high and substantially flat gain response in the audio band. The audio band can be defined to be any band within the typical definition of an audio band. A typical definition can be 20 Hz to 20 KHz. Exemplary lower cut-off frequencies for an audio band can be: 20 Hz, 50 Hz, 80 Hz, 100 Hz, 150 Hz, 200 Hz, 250 hz. Exemplary upper cutoff frequencies the an audio band could be 3 KHz, 5 KHz, 8 KHz, 10 KHz, 18 KHz, 20 KHz. By substantial flat is meant gain response variations within approximately +/−1 dB; +/−3 dB; +/−4 dB; +/−6 dB. However, other additional values of variation can be used to define the term 'substantial flat'.

In the above different preamplifier configurations have been disclosed. These configurations comprise different input/output terminal configurations e.g. a two-terminal configuration. However, it should be noted that three, four or more terminals can be provided for input/output of signals to microphone and preamplifier. Especially, it should be noted that separate terminals can be provided for supply voltage (at a first terminal) and preamplifier output (at a second terminal). In case of a differential preamplifier output two terminals for the output signals can be provided in addition to a terminal for power supply. A separate terminal is provided for a ground reference. This ground reference is typically, but not always, shared by the power supply and output signal.

The invention claimed is:

1. A microphone preamplifier, comprising:
   a semiconductor substrate;
   a differential amplifier integrated on the semiconductor substrate having an input stage with an inverting input terminal and a non-inverting input terminal and an output stage with an output terminal wherein an audio frequency input signal from a microphone is to be applied to the non-inverting input terminal;
   a feedback circuit also integrated on the semiconductor substrate comprising an active device which provides an ohmic impedance across a two-port circuit having a low-pass frequency transfer function that couples a part of the input signal from the output terminal back to the inverting input terminal; and
   a DC offset implemented in at least one of at the input stage, in the input stage, or in the feedback circuit to set the DC bias voltage at the output terminal.

2. A microphone preamplifier according to claim 1, wherein the feedback circuit is a filter with a transfer function, in the frequency domain, with a zero and a pole; wherein the zero is located at a higher frequency than the pole.

3. A microphone preamplifier according to claim 1, wherein the preamplifier has a transfer function, in the frequency domain, with a zero and a pole; wherein the pole is located in the range 0.1 Hz to 50 Hz or 0.1 Hz to 100 Hz or 0.1 to 200 Hz.

4. A microphone preamplifier according to claim 1, wherein the feedback circuit is a filter which, in the frequency domain, has a relatively high gain level below a transition frequency range and a relatively low gain level above the transition frequency range.

5. A microphone preamplifier according to claim 4, wherein the transition frequency range is located below a frequency of about 100 Hz.

6. A microphone preamplifier according to claim 4, wherein the transition frequency range is located below a frequency of 40 Hz.

7. A microphone preamplifier according to claim 1, wherein the feedback circuit is an active filter.

8. A microphone preamplifier according to claim 1, wherein the feedback circuit is a passive filter.

9. A microphone preamplifier according to claim 1, wherein the feedback circuit comprises a configuration with a first and a second active device and a current source, where the devices comprise a respective gate terminal, a source terminal and a drain terminal, and where the gate terminals are interconnected at a node connected to the current source and the drain terminal of the first device, and where the source terminals are interconnected, to provide the second device in a state where an ohmic resistance is provided between its drain and source terminal.

10. A microphone preamplifier according to claim 1, wherein the feedback circuit comprises a filter with an input port connected to a series connection of a first and second resistor which forms a resistor node at their interconnection, and connected to a series connection of a first and second capacitor which forms a capacitor node at their interconnection; and an output port at the capacitor node; wherein the resistor node and capacitor node are interconnected by an active device which provides an ohmic impedance across a two-port circuit.

11. A microphone preamplifier according to claim 1, wherein the feedback circuit comprises a source providing a DC offset.

12. A microphone preamplifier according to claim 1, wherein the feedback circuit comprises a filter with a source that provides a DC offset.

13. A microphone preamplifier according to claim 1, wherein the DC offset is provided at the inverting input terminal by a circuit configuration comprising a current source coupled, at the circuit node of the inverting input terminal a resistor, a diode, or an active device which provides an ohmic impedance across a two-port circuit.

14. A microphone preamplifier according to claim 13, wherein the active device constitutes a second device in a configuration with a first and the second active device and a current source, where the devices comprise a respective gate terminal, a source terminal and a drain terminal, and where the gate terminals are interconnected at a node connected to the current source and the drain terminal of the first device, and where the source terminals are interconnected, to provide the second device in a state where an ohmic resistance is provided between its drain and source terminal.

15. A microphone preamplifier according to claim 1, wherein the input stage comprises a first and second current path for the respective signal inputs, and wherein a DC offset is provided by establishing different DC currents through the first and second current path of the input stage.

16. A microphone preamplifier according to claim 1, wherein the differential amplifier is configured to convert an input signal into a common mode signal for low frequencies and into a differential signal for audio frequencies.

17. A microphone preamplifier according to claim 1, wherein the differential amplifier is configured as an instrumentation type amplifier with two inputs and a first and a second output, wherein the first and second input is arranged to receive a microphone signal, but wherein the inputs are coupled to receive the microphone signals substantially in phase at relatively low frequencies and substantially out of phase at relatively high frequencies.

18. A microphone preamplifier according to claim 1, wherein the differential amplifier is configured to provide frequencies below an audio band as common mode signals and audio band signals as differential mode signals.

19. A microphone preamplifier according to claim 1, wherein a phase shifter is coupled between the inputs of the differential amplifier.

20. A microphone preamplifier according to claim 1, wherein a phase shifter is cross coupled between an output of one side of the differential amplifier and an input of the opposite side of the differential amplifier.

21. A microphone preamplifier according to claim 1, further comprising a voltage pump integrated on the semiconductor substrate.

22. A microphone module comprising the microphone preamplifier according to claim 1, and further comprising an electret microphone configured to provide a microphone signal, responsive to a sound pressure on the electret microphone, to the microphone preamplifier.

23. A microphone module comprising the microphone preamplifier according to claim 1, and further comprising an electret microphone mounted inside a space formed by a cartridge, and wherein the microphone preamplifier is integrated within the microphone module.

24. A microphone preamplifier according to claim 1, and further comprising a MEMS microphone member to provide a microphone signal, responsive to a sound pressure on the MEMS microphone, to the microphone preamplifier.

25. A microphone preamplifier according to claim 24, wherein the MEMS microphone member and the microphone preamplifier are integrated on a semiconductor substrate.

26. The microphone preamplifier as claimed in claim 1 wherein said differential amplifier has a high pass frequency transfer function and said feedback circuit has a low-pass frequency transfer function that reduces the low frequency output of the preamplifier.

27. A microphone preamplifier according to claim 1, wherein the DC offset is implemented by a combination of DC offsets selected from a group of at the input stage, in the input stage and in the feedback circuit.

28. A microphone preamplifier according to claim 1, wherein the differential amplifier is configured to convert an input signal into a common mode signal for low frequencies and into a differential signal for audio frequencies.

29. A microphone preamplifier according to claim 1, and further comprising a phase shifter cross coupled between an output of one side of the differential amplifier and an input of the opposite side of the differential amplifier.

30. A microphone preamplifier comprising:
a semiconductor substrate;
a differential amplifier integrated on the semiconductor substrate having an input stage with a first signal input terminal and a second signal input terminal and an output stage with an output terminal wherein an audio frequency input signal from a microphone is to be applied to the second signal input terminal;

a feedback circuit also integrated on the semiconductor substrate comprising an active device which provides an ohmic impedance across a two-port circuit having a low-pass frequency transfer function that couples a part of the input signal from the output terminal back to the first signal input terminal; and a DC offset implemented in at least one of at the input stage, in the input stage, or in the feedback circuit to set the DC bias voltage at the output terminal, wherein the preamplifier is configured to receive the microphone signal via an input bias element which has relatively high ohmic impedance when the microphone signal is relatively small in magnitude and relatively low ohmic impedance when the microphone signal is relatively high in magnitude.

31. A microphone preamplifier according to claim 30, wherein the bias element is configured by two cross-coupled diodes.

32. A microphone preamplifier according to claim 30, wherein the bias element is configured by two cross-coupled bipolar transistors.

33. A microphone preamplifier according to claim 30, wherein the bias element is configured by two cross-coupled Metal Oxide Semiconductor, MOS, devices.

34. A microphone preamplifier according to claim 33, wherein a phase shifter is coupled between a signal node, substantially in phase with an input signal to the amplifier, and an input terminal of an opposite side of the differential amplifier.

35. A microphone preamplifier according to claim 30, wherein the input stage comprises an inverting input and a non-inverting input, wherein the non-inverting input is the second signal input terminal and is to receive the microphone signal, and the inverting input is the first signal input terminal and is to receive a feedback signal provided by the feed-back circuit.

36. A microphone preamplifier according to claim 30, wherein the feedback circuit is a filter with a transfer function, in the frequency domain, with a zero and a pole; wherein the zero is located at a higher frequency than the pole.

37. A microphone preamplifier according to claim 30, wherein the preamplifier has a transfer function, in the frequency domain, with a zero and a pole; wherein the pole is located in the range 0.1 Hz to 50 Hz or 0.1 Hz to 100 Hz or 0.1 to 200 Hz.

38. A microphone preamplifier according to claim 30, wherein the feedback circuit is a filter which, in the frequency domain, has a relatively high gain level below a transition frequency range and a relatively low gain level above the transition frequency range.

39. A microphone preamplifier according to claim 30, wherein the transition frequency range is located below a frequency of about 100 Hz.

40. A microphone preamplifier according to claim 30, wherein the transition frequency range is located below a frequency of 40 Hz.

41. A microphone preamplifier according to claim 30, wherein the feedback circuit is an active filter.

42. A microphone preamplifier according to claim 30, wherein the feedback circuit is a passive filter.

43. A microphone preamplifier according to claim 30, wherein the feedback circuit comprises a configuration with a first and a second active device and a current source, where the devices comprise a respective gate terminal, a source terminal and a drain terminal, and where the gate terminals are interconnected at a node connected to the current source and the drain terminal of the first device, and where the source terminals are interconnected, to provide the second device in a state where an ohmic resistance is provided between its drain and source terminals.

44. A microphone preamplifier according to claim 30, wherein the feedback circuit comprises a filter with an input port connected to a series connection of a first and second resistor which forms a resistor node at their interconnection, and connected to a series connection of a first and second capacitor which forms a capacitor node at their interconnection; and an output port at the capacitor node; wherein the resistor node and capacitor node are interconnected by an active device which provides an ohmic impedance across a two-port circuit.

45. A microphone preamplifier according to claim 30, wherein the feedback circuit comprises a source providing a DC offset.

46. A microphone preamplifier according to claim 30, wherein the feedback circuit comprises a filter with a source that provides a DC offset.

47. A microphone preamplifier according to claim 30, wherein the DC offset is provided at the first signal input terminal by a circuit configuration comprising a current source coupled, at the circuit node of the first signal input terminal a resistor, a diode, or an active device which provides an ohmic impedance across a two-port circuit.

48. A microphone preamplifier according to claim 47, wherein the active device constitutes a second device in a configuration with a first and the second active device and a current source, where the devices comprise a respective gate terminal, a source terminal and a drain terminal, and where the gate terminals are interconnected at a node connected to the current source and the drain terminal of the first device, and where the source terminals are interconnected, to provide the second device in a state where an ohmic resistance is provided between its drain and source terminals.

49. A microphone preamplifier according to claim 30, wherein the input stage comprises a first and second current path for the respective signal inputs, and wherein a DC offset is provided by establishing different DC currents through the first and second current path of the input stage.

50. A microphone preamplifier according to claim 30, wherein the differential amplifier is configured as an instrumentation type amplifier with two inputs and a first and a second output, wherein the first and second input is arranged to receive a microphone signal, but wherein the inputs are coupled to receive the microphone signals substantially in phase at relatively low frequencies and substantially out of phase at relatively high frequencies.

51. A microphone preamplifier according to claim 30, wherein the differential amplifier is configured to provide frequencies below an audio band as common mode signals and audio band signals as differential mode signals.

52. A microphone preamplifier according to claim 30, and further comprising a phase shifter coupled between inputs of the differential amplifier.

53. A microphone preamplifier according to claim 30, and further comprising a voltage pump integrated on the semiconductor substrate.

54. A microphone module comprising the microphone preamplifier according to claim 30, and further comprising an electret microphone configured to provide a microphone signal, responsive to a sound pressure on the electret microphone, to the microphone preamplifier.

55. A microphone module comprising the microphone preamplifier according to claim 30, and further comprising an electret microphone mounted inside a space formed by a cartridge, and wherein the microphone preamplifier is integrated within the microphone module.

56. A microphone preamplifier according to claim 30, and further comprising a MEMS microphone member to provide a microphone signal, responsive to a sound pressure on the MEMS microphone, to the microphone preamplifier.

57. A microphone preamplifier according to claim 56, wherein the MEMS microphone member and the microphone preamplifier are integrated on a semiconductor substrate.

58. The microphone preamplifier as claimed in claim 30 wherein said differential amplifier has a high pass frequency transfer function and said feedback circuit a low-pass frequency transfer function that reduces the low frequency output of the preamplifier.

59. A microphone preamplifier according to claim 30, wherein the DC offset is implemented by a combination of DC offsets selected from a group of at the input stage, in the input stage and in the feedback circuit.

* * * * *